United States Patent
Lankhorst et al.

(10) Patent No.: US 8,115,239 B2
(45) Date of Patent: Feb. 14, 2012

(54) ELECTRIC DEVICE COMPRISING PHASE CHANGE MATERIAL

(75) Inventors: Martijn Henri Richard Lankhorst, Eindhoven (NL); Erwin Rinaldo Meinders, Veldhoven (NL); Robertus Adrianus Maria Wolters, Eindhoven (NL); Franciscus Petrus Widdershoven, Eindhoven (NL)

(73) Assignee: NXP B.V., Eindhoven (NL)

(*) Notice: Subject to any disclaimer, the term of this patent is extended or adjusted under 35 U.S.C. 154(b) by 1359 days.

(21) Appl. No.: 10/599,270

(22) PCT Filed: Mar. 16, 2005

(86) PCT No.: PCT/IB2005/050923
§ 371 (c)(1),
(2), (4) Date: Sep. 25, 2006

(87) PCT Pub. No.: WO2005/093839
PCT Pub. Date: Oct. 6, 2005

(65) Prior Publication Data
US 2008/0285333 A1    Nov. 20, 2008

Related U.S. Application Data

(63) Continuation-in-part of application No. 10/539,251, filed on Jun. 15, 2005.

(30) Foreign Application Priority Data

Mar. 26, 2004 (EP) .................................... 04101259

(51) Int. Cl.
*H01L 29/76* (2006.01)
(52) U.S. Cl. ........................ 257/246; 257/248
(58) Field of Classification Search .................. 257/246, 257/248
See application file for complete search history.

(56) References Cited

U.S. PATENT DOCUMENTS

| | | | |
|---|---|---|---|
| 5,296,716 A | 3/1994 | Ovshinsky et al. | |
| 5,789,758 A | 8/1998 | Reinberg et al. | |
| 5,825,046 A * | 10/1998 | Czubatyj et al. | 257/2 |
| 5,912,839 A | 6/1999 | Ovshinsky et al. | |
| 5,933,365 A | 8/1999 | Klersy et al. | |
| 6,075,719 A | 6/2000 | Lowery et al. | |
| 6,339,544 B1 | 1/2002 | Chiang et al. | |
| 6,545,903 B1 | 4/2003 | Wu | |
| 6,625,054 B2 | 9/2003 | Lowery et al. | |
| 6,687,153 B2 | 2/2004 | Lowery et al. | |
| 6,707,712 B2 | 3/2004 | Lowery | |
| 6,750,469 B2 | 6/2004 | Ichihara et al. | |
| 6,778,420 B2 * | 8/2004 | Parkinson | 365/100 |
| 2003/0142578 A1 | 7/2003 | Hsu et al. | |
| 2003/0179633 A1 | 9/2003 | Krieger et al. | |

OTHER PUBLICATIONS

WIPO. "International Preliminary Report on Patentability." International Application No. PCT/IB2005/050923. Report Issued: Feb. 20, 2007. pp. 9.
WIPO, "International Search Report." International Application No. PCT/IB2005/050923. Report Date: Mar. 6, 2005. pp. 5.

* cited by examiner

*Primary Examiner* — Eugene Lee

(57) ABSTRACT

The electric device according to the invention has a resistor comprising a layer of a phase change material which is changeable between a first phase with a first electrical resistivity and a second phase with a second electrical resistivity different from the first electrical resistivity. The phase change material is a fast growth material. The electric device further comprises a switching signal generator for switching the resistor between at least three different electrical resistance values by changing a corresponding portion of the layer of the phase change material from the first phase to the second phase.

21 Claims, 14 Drawing Sheets

Figure 1B:
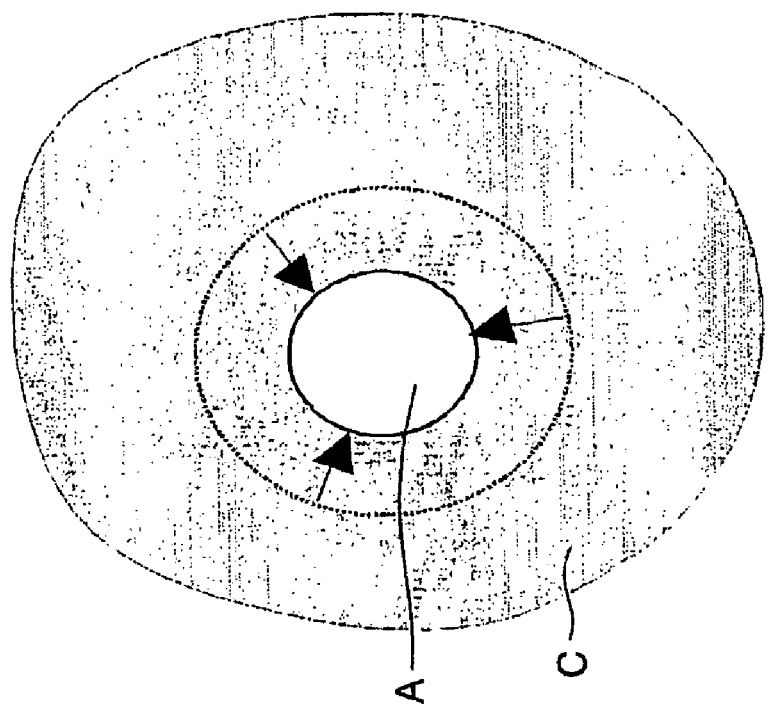

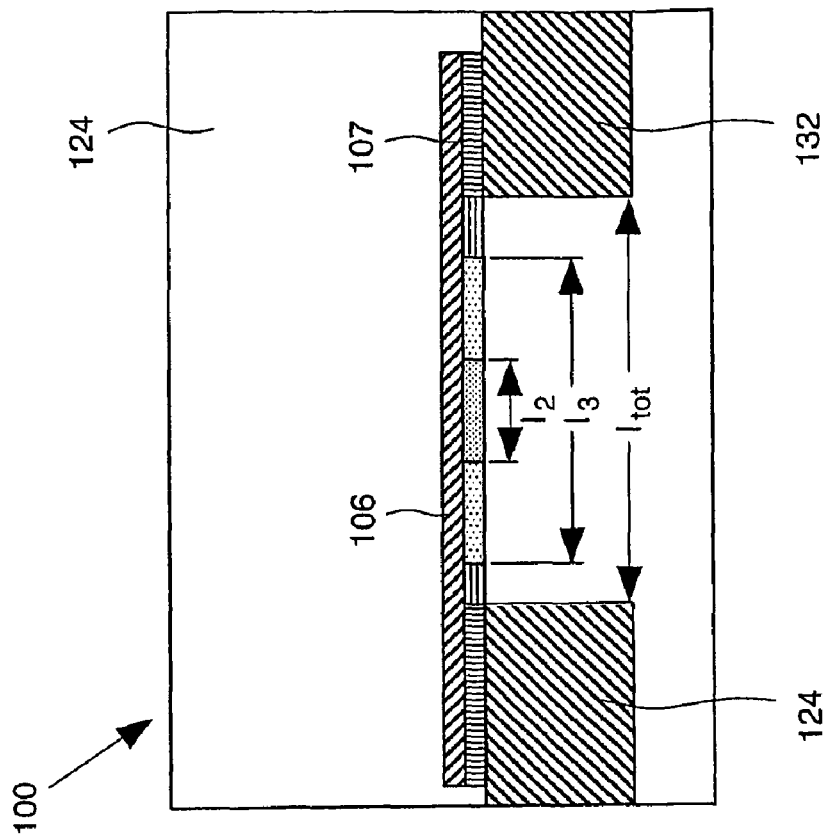
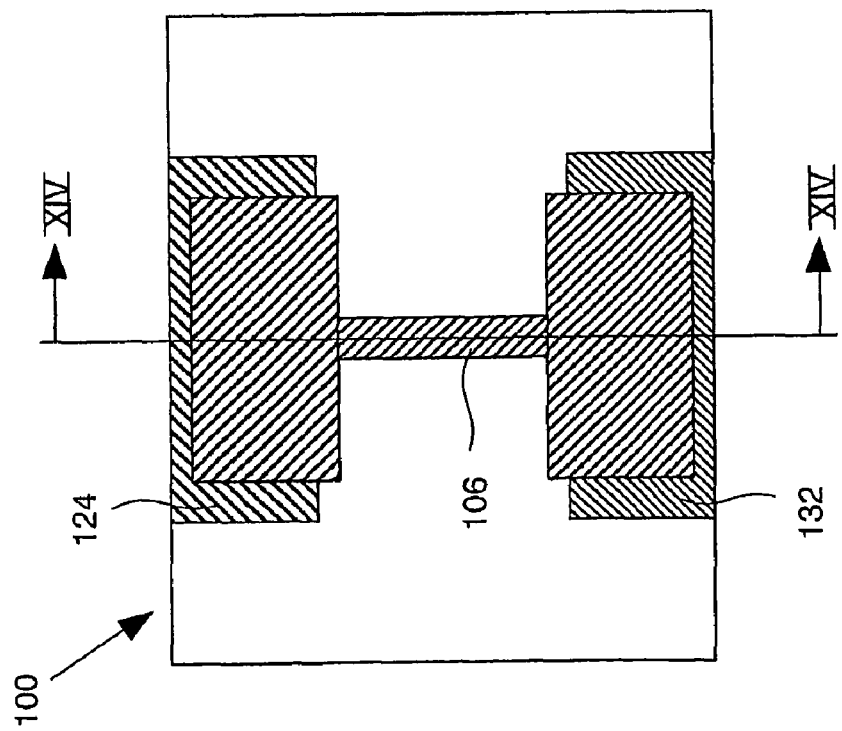

ELECTRIC DEVICE COMPRISING PHASE CHANGE MATERIAL

This application is a Continuation-in-part of application Ser. No. 10/539,251, filed on Jun. 15, 2005.

The invention relates to an electric device having a resistor comprising a layer of a phase change material.

The invention further relates to a method of operating such an electric device.

WO-A 00/57,498 discloses a so-called Ovonic EEPROM, which is a non-volatile, thin-film electronic memory device capable of both analog and digital forms of information storage. The known electric device has a resistor comprising a phase change material, which has approximately a composition of $Sb_2Te_5Ge_2$. It may be, e.g., $Sb_{22}Te_{56}Ge_{22}$ or $Sb_{29}Te_{57}Ge_{14}$. The phase change material is able to be in a first phase, which may be, e.g., crystalline, and it is able to be in a second phase, which may be, e.g., amorphous. Alternatively, one or both of the first phase and the second phase may be partly amorphous and partly crystalline, provided that the resistor with the phase change material in the first phase and the resistor with the phase change material in the second phase have different values of the electrical resistance.

The resistor is electrically connected to a first conductor and a second conductor such that the value of the electrical resistance may be measured. The resistor, the first conductor and the second conductor are able to conduct a current which, via heating, enables transitions of the phase change material between the first phase and the second phase. It is believed that in the case of a transition from a phase with a relatively good conductivity, such as a crystalline phase or a mainly crystalline phase, to a phase with a relatively poor conductivity, such as an amorphous phase or a mainly amorphous phase, heating by means of a sufficiently strong current causes the phase change material to melt. Hereinafter, the terms "crystalline" and "amorphous" are used to refer to a crystalline phase or a mainly crystalline phase, and to an amorphous phase or a mainly amorphous phase, respectively. Said heating may be achieved by the resistance of the first conductor, the second conductor, the resistor itself and the contact resistance between these elements. Which of these resistances contributes most to the heating depends in general on the materials and shapes of these elements. The heating process ends when switching off the current. The phase change material then cools down and arranges in a more amorphous order.

When inducing a transition from a phase with a relatively low electrical conductivity to a phase with a relatively high electrical conductivity, the heating is initially counteracted by the poor conductivity, which limits the current conducted through the phase change material. It is believed that by applying a sufficient voltage, the so-called breakdown voltage, across the resistor it is possible to locally induce an electrical breakdown in the phase change material, which leads to a high local current density. The corresponding heating then is sufficient to increase the temperature of the phase change material above its crystallization temperature, thereby enabling the phase transition from the amorphous phase to the crystalline phase.

The known electric device is particularly suited for use as an electrically writable and erasable memory cell, which carries information encrypted in the value of the electrical resistance. The memory cell is assigned, e.g., a "0" when the resistance is relatively low and a "1" when the resistance is relatively high. The resistance may be easily measured by supplying a voltage across the resistor and measuring the corresponding current. The memory element may be written and erased by inducing a transition from a first phase to a second phase, as described above.

The phase change material may also be electrically switched between different detectable states of local order across the entire spectrum between completely amorphous and completely crystalline states. That is, the switching of such materials is not required to take place between completely amorphous and completely crystalline states but rather may take place in incremental steps reflecting either (1) changes of local order, or (2) changes in volume of two or more materials having different local order so as to provide a "gray scale" represented by a multiplicity of conditions of local order spanning the spectrum between the completely amorphous and the completely crystalline states. The phase change materials exhibit different electrical characteristics depending upon their state. For example, in its amorphous state the material exhibits a higher electrical resistivity than it does in its crystalline state. The electrical resistance values may be controlled by adjusting the amplitude and/or the duration of the current used for changing the phase change material.

It is a disadvantage of the known electric device that the different detectable states of local order across the entire spectrum between completely amorphous and completely crystalline states are relatively difficult to adjust.

It is an object of the invention to provide an electric device as described in the opening paragraph, in which the different detectable states of local order across the entire spectrum between completely amorphous and completely crystalline states are relatively easy to adjust.

The invention is defined by the independent claims. The dependent claims define advantageous embodiments.

The invention is based on the insight that in the known electric device, the phase change material is a nucleation type of phase change material. In this type of materials the phase transition from the amorphous phase A to the crystalline phase C takes place by nucleation, i.e. the crystallization starts from several randomly distributed points, so-called nucleation centers, within the amorphous phase A as is shown schematically in FIG. 1A. Once the crystallization is initiated at these nucleation centers, crystallites start to grow from them. The dynamics of this growth is relatively complicated and may show an exponential time dependence. A model for this crystallization mechanism is published in the article "Crystallization studies of Ge:Sb:Te optical memory materials" by J. Gonzales-Hernandez, B. S. Chao, D. Strand, S. R. Ovshinsky, D. Pawlik, P. Gasiorowski, published in Applied Physics Communications, volume 11, pages 557-581, 1992. Because of this relatively complicated crystallization mechanism, it is relatively complicated to adjust the current required for obtaining the at least three distinct detectable levels of electrical resistance values. For example, when it is desired to have at least three different equidistant resistance values, the duration of the current for setting these resistance values depends nonlinearly on the resistance value to be set.

In contrast to this, the electric device according to the invention comprises a phase change material which is a so-called fast growth material. This class of phase change materials has a different crystal growth mechanism than the class of known phase change materials. In fast growth materials the crystalline phase C grows at a relatively high approximately constant speed, the so-called crystallization speed, from the interface between the amorphous phase A and the crystalline phase C, as is shown schematically in FIG. 1B. The dotted line in FIG. 1B indicates the interface between the crystalline phase C and the amorphous phase A at the start of the crystallization process, the solid line shows the interface after partial (re-)crystallization, the arrows indicate the growth direction. The (re-)crystallization does substantially not involve crystallization starting from randomly distributed crystallization centers. Since the crystallization of the amorphous phase proceeds along the interface between these two phases at the, approximately constant, crystallization speed, the growth mechanism is relatively simple and, consequently, it is relatively easy to adjust the current required for obtaining the at least three distinct detectable levels of electrical resistance values. In the electric device according to the invention there may be approximately a linear relation between the resistance value and the time during which the amorphous phase is (re-) crystallized by applying a current sufficient to heat the phase change material above the crystallization temperature. This will be explained below with reference to FIGS. 16A and 16B.

In the known phase change material, (re-)crystallizing an entirely amorphous phase, i.e. a phase substantially free of crystallites, requires a crystallization time which is approximately independent of the volume of the amorphous phase. It is restricted by the nucleation time which is of the order of 50 ns for the known phase change materials.

In contrast to this, for the fast growth materials the crystallization time depends on the volume of the amorphous phase to be (re-)crystallized. This allows for a relatively short switching time from the entirely amorphous phase to an at least partly crystalline phase, in particular when the size of the amorphous phase is relatively small, e.g. below 50 nm.

In the field of optical recording, this latter advantageous property related to the phase transition between the amorphous phase and the crystalline phase of $Sb_{69}Te_{31}$ is known from the article "Phase-change media for high-numerical-aperture and blue-wavelength recording" by H. J. Borg et al., Japanese Journal of Applied Physics, volume 40, pages 1592-1597, 2001. This article, however, does not mention that fast growth materials surprisingly have other properties which make them suitable as phase change material in the electrical device according to the invention. The inventors of the present invention have in particular established that these fast growth phase change materials are changeable between a first phase with a first electrical resistivity and a second phase with a second electrical resistivity different from the first electrical resistivity, the resistor having an electrical resistance which depends on the volume of the phase change material in the first phase and the second phase, respectively, the resistor being switchable between at least three different electrical resistance values by changing a corresponding portion of the layer of the phase change material from the first phase to the second phase. The switching of the resistor between the at least three different electrical resistance values may be done by supplying an electrical current for Joule heating of the phase change material.

The electric device according to the invention may have an additional advantage in that the intermediate resistance value or, when there are more than three different resistance values, the intermediate resistance values may be more stable than in the known device. For such an intermediate resistance value the phase change material is partly amorphous and partly crystalline. At the interface between the crystalline phase and the amorphous phase some of the atoms of the amorphous phase may spontaneously grow on the crystal phase, leading to an increase of the crystalline phase and a decrease of the amorphous phase. As a consequence, the resistance value of the resistor may change over time. Ultimately this may lead to a change which is so large that the originally written resistance value can no longer be retrieved. The probability of such spontaneous growth of the crystalline phase increases with increasing interface area between the crystalline phase and the amorphous phase. Thus, the intermediate state closest to the state with the lowest resistance value, e.g. the completely crystalline state, will have the lowest stability against spontaneous crystallization.

Figure 1A:
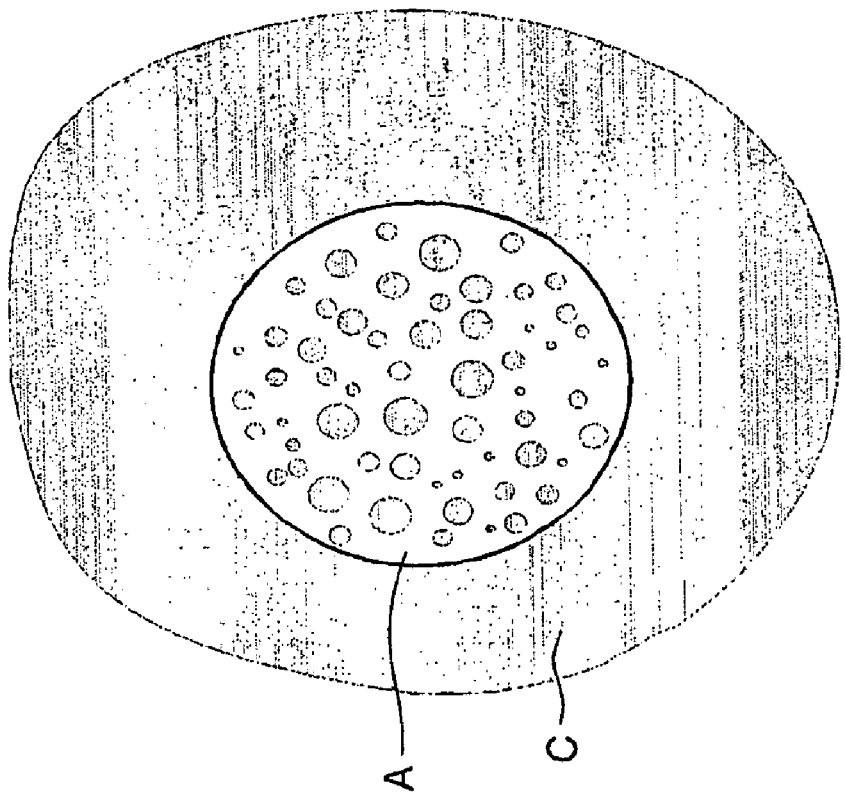

In the known device there are several relatively small crystallites surrounded by amorphous portions A of phase change material, which is shown schematically in FIG. 1A. In contrast to this, in the device according to the invention the crystalline phase C and the amorphous phase A are separated by a single continuous interface, as is shown schematically in FIG. 1B. The resistance values for the layers of phase change material shown in FIGS. 1A and 1B are approximately equal, but the interface between the amorphous phase A and the crystalline phase C is smaller in the device according to the invention, see FIG. 1B, than in the known device, see FIG. 1A. Therefore, the intermediate resistance values may be more stable in the device according to the invention shown in FIG. 1B than in the known device shown in FIG. 1A. Often, the stability of the intermediate resistance value is dependent not only on the geometrical effect described in the previous two paragraphs, but also on the chemical composition of the phase change material and on the temperature.

The non-prepublished European patent application with application number 03310058 3.8, discloses an electric device with a body having a resistor comprising a phase change material being changeable between a first phase and a second phase, the resistor having an electrical resistance which depends on whether the phase change material is in the first phase or the second phase, the resistor being able to conduct a current for enabling a transition from the first phase to the second phase, the phase change material being a fast growth material. In an embodiment thereof the phase change material of the resistor is in direct contact with a crystallization layer having a crystal structure. The crystallization layer is particularly advantageous if multi bits are stored in one electric device. In this case the volume of the phase change material undergoing the phase transition determines which bit is stored. The non-prepublished European patent application with application number 03310058 3.8, does not disclose that the resistor is switchable between at least three different electrical resistance values by changing a corresponding portion of the layer of the phase change material from the first phase to the second phase. The electric device known from the non-prepublished European patent application with application number 03310058 3.8, does not comprise means for switching the resistor between at least three different electrical resistance values by changing a corresponding portion of the layer of the phase change material from the first phase to the second phase.

In an embodiment of the present invention, the electric device comprises means for switching the resistor between at least three different electrical resistance values, said means preferably comprising a signal generator able to generate an electrical signal to adjust the resistance value. Examples of the electrical signal will be described below with reference to FIGS. 15A and 15B.

In an embodiment the portion of the layer of phase change material undergoing the phase change is in direct contact with a further resistor arranged in parallel with the resistor. In such an electric device the further resistor may function as a heating element of the phase change material. The Joule heating by the heating element is then effective even if the phase change material is in the amorphous phase, because the heating element is arranged in parallel with the resistor. When the phase change material is in the amorphous phase, a voltage applied to the resistor leads to a current flowing at least partly through the heating element, leading to effective heating of the phase change material without requiring an electrical breakdown. This heating promotes the phase change, thereby improving the endurance of the electric device.

The further resistor may have a further electrical resistance which is smaller than the largest of the at least three different electrical resistance values. The effective electrical resistance R of such an electric device is that of two parallel resistors, one of which is the resistor comprising the layer of phase change material, and the other is the further resistor. An example of such a device is shown in cross-section in FIG. 2B. The layer 7 of phase change material and the further resistor 6 are two cuboids which both have a total length $l_{tot}$. They have a height $h_{pcm}$ and $h_{fr}$ and a width $w_{pcm}$ and $w_{fr}$, respectively. According to the invention the layer 7 may be switched between at least three different resistance values. The switching of the resistance value is done by changing a corresponding portion of the layer 7 of the phase change material from the first phase to the second phase. In one state corresponding to one resistance value, substantially the entire layer 7 may be in the crystalline phase C. In another state corresponding to another resistance value, substantially the entire layer 7 may be in the amorphous phase A. In yet another state corresponding to yet another resistance value, the layer 7 may be composed of a part of length l which is in the amorphous phase A, and a remaining part which is in the crystalline phase C, as is shown schematically in FIG. 2B. Instead of, or in addition to, the state corresponding to the completely amorphous phase A and/or to the completely crystalline phase C, the length of the amorphous part may be changed from l to one or more different values l' which lead to a different resistance value.

For the example shown schematically in FIG. 2B the resistance R between the outer ends in the longitudinal direction of both layer 7 and further resistor 6 may be calculated as follows: the resistance of the crystalline part of layer 7 and the corresponding part of further resistor 6 and the resistance of the amorphous part of layer 7 and the corresponding part of further resistor 6 are calculated using the formula for the resistance of two parallel resistors. Subsequently, the resulting two values of the resistance are added to obtain the resistance R.

Figure 2A:
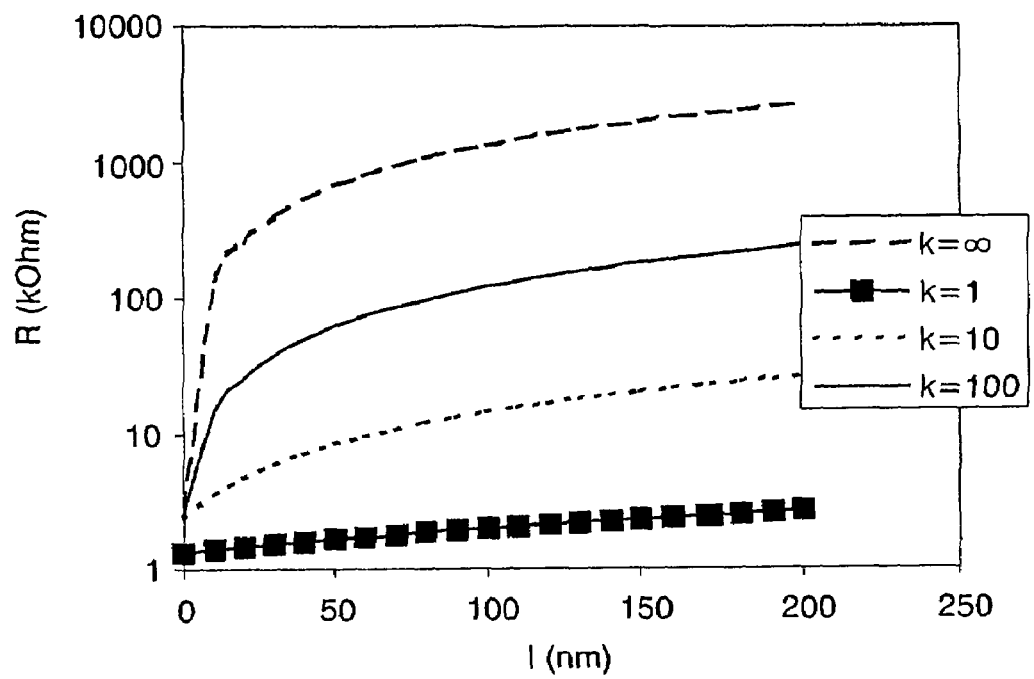

In FIG. 2A the resistance R thus calculated is shown as a function of the length l of the amorphous part of layer 7 for various values of a parameter k, which is the ratio of the further resistance of the further resistor 6 over the resistance of layer 7 that is entirely in the crystalline phase C. The value of k=∞ corresponds to a situation where the further resistor is effectively absent. In the calculation shown in FIG. 2A the resistivity of the amorphous phase A and the crystalline phase C is 500 mOhm cm and 0.5 mOhm cm, respectively. The length $l_{tot}$ is 200 nm, the width $w_{pcm}$ is 25 nm and the height $h_{pcm}$ is 15 nm.

The height $h_{fr}$ and the width $w_{fr}$ as well as the resistivity of the further resistor 6 may be chosen in dependence on the desired value of k.

In the calculation shown in FIG. 2A the contact resistance between the layer 7 of phase change material and the further resistor 6 is neglected. This contact resistance will in general reduce the amount of current that flows from the layer of the phase change material to the further resistor, and vice versa. A number of advantageous effects of the further resistor discussed below may be less efficient when the contact resistance is relatively high. It is preferred that the contact resistance be $10^{-7}$ V cm²/A or less, preferably $10^{-8}$ V cm²/A or less, preferably $10^{-9}$ V cm²/A or less. This allows for a relatively easy change of the current from the layer of the phase change material to the further resistor, and vice versa.

The layer 7 and/or further resistor 6, if present, may have shapes other than that of a cuboid. For shapes other than that of a cuboid, there may be a nonlinear relation between the resistance value of the phase change material and the time during which the amorphous phase is (re-)crystallized. Even in such cases the growth mechanism of the phase change material according to the invention renders the time dependence less steep than in the known device. The amorphous part of layer 7 may be located at an outer end of layer 7 and may comprise an interface with another material such as e.g. the first conductor and/or the second conductor used for electrically contacting the layer 7. Alternatively, or in addition, the amorphous part of layer 7 may be free of interfaces with another conductive material. The location of the amorphous part depends on the design parameters of the electric device such as the contact resistance between layer 7 and the first conductor and the second conductor, the thermal conductivity of the first conductor, the second conductor, the further resistor, if present, and other materials of the electric device such as dielectric surrounding the layer 7, if present.

As is shown in FIG. 2A the presence of the further resistor 6 reduces the largest effective electrical resistance value which is obtained when layer 7 is entirely amorphous, in this example at l=200 nm. This is an additional advantage because the total resistance R remains relatively small when using the further resistor 6, which allows for the use of relatively simple read circuitry for determining the resistance value. In the absence of the further resistor 6 the value of R changes between 270 kOhm and 2.70 MOhm when changing l from 10 nm to 200 nm. The resistance of the amorphous phase may depend exponentially on the temperature, which may render the measurement of the resistance of the amorphous phase relatively complicated. This may make it relatively difficult to differentiate between resistance values based on differences in size of the amorphous part. When using the further resistor 6, the values of the resulting resistance levels will depend much less on temperature and can be differentiated more easily. Differences between such large resistance values are relatively complicated to measure. When the further resistor is present the resistance R may be well below 300 kOhm or even below 30 kOhm, even when layer 7 is entirely in the amorphous phase as is shown for k=100 and k=10, respectively.

In practice, a minimum read current may have to flow through the layer of phase change material and the further resistor in order to be able to reliably establish the resistance value of these two elements. The minimum read current may have to be larger than the sum of all leakage currents through a bit line when the resistance of the layer of phase change material and the further resistor is measured by detecting the current through this bit line. It may be advantageous for the read current to be equal to or larger than a minimum value I of 1 microA, such as e.g. 10 microA or even larger.

A voltage V may be used for generating the read current I through the layer of phase change material and the further resistor. The voltage V may be e.g. 0.1 V or larger, such as e.g. 0.5 V. Preferably, the voltage V is smaller than the threshold voltage of the phase change material to prevent partial or even complete (re-)crystallization of the amorphous part during a reading operation. Preferably, the voltage V is at least 0.1 V smaller than the threshold voltage.

Figure 2B:
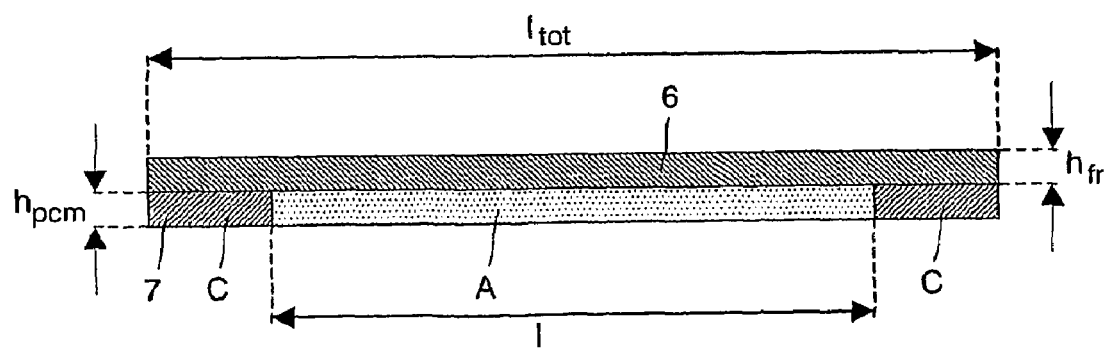

For a voltage V of 0.5 V in the example shown in FIG. 2B, the total maximum resistance R of the layer of phase change material and the further resistor has to satisfy R<V/I, which implies in this example that R<50 kOhm holds. This condition has to be met in particular when the amorphous part of the layer of phase change material is largest. In such a case the resistance R may be approximated by the resistance $R_{fr}$ of the further resistor. Within this approximation, the parameter k, which is the ratio of the further resistance of the further resistor over the resistance $R_{cr}$ of the layer of phase change material being entirely in the crystalline phase, satisfies $k=R_{fr}/R_{cr}\approx R/R_{cr}<V/(I*R_{cr})$. For the example of FIG. 2B this implies that k<19 holds. For other dimensions of the layer of phase change material and/or the further resistor, the preferred upper limit of k may be calculated from the above equation.

The electric device may comprise a read out signal generator for providing an electric read signal having a read voltage V to the resistor. Depending on the effective resistance value R a certain current then flows. This current may be measured and, by means of a read out circuit of the electric device, the resistance value may be determined from the electric read signal. The read out circuit may require a minimum current I for reliably measuring the resistance value. The further resistance $R_{fr}$ may be preferably smaller than the read voltage V divided by the minimum current I, i.e. $R_{fr}<V/I$ holds. When this condition is met, the resistance value R, and in particular the maximum resistance $R_{max}$, may be established reliably.

Alternatively, the electric device may comprise a read out signal generator for providing an electric read signal having a read current I to the resistor. The read out circuit for determining the resistance value from the electric read signal may then measure the voltage over the resistor, and the further resistor, if present. The read out circuit may require a minimum voltage V for reliably measuring the resistance value. The further resistance $R_{fr}$ may be preferably smaller than the minimum voltage V divided by the read current I, i.e. $R_{fr}<V/I$ holds. When this condition is met, the resistance value may be established reliably.

For a reliable measurement of the intermediate resistance value, or intermediate resistance values when more than one intermediate resistance value is available, it is often advantageous if the relative difference $dR_i/R_i=(R_i-R_{i-1})/R_i$, $R_i$ being the N different resistance values, i being an integer between 2 and N, is larger than a certain minimum relative resistance difference, $(dR/R)_{min}$. The lower limit for $(dR/R)_{min}$ depends on the sensitivity of the read circuit used for reading out the resistance value R. The sensitivity may be limited by the electric elements such as transistors used therein and/or by other effects such as leakage currents. $(dR/R)_{min}$ may be equal to or larger than 0.1, such as 0.3 or larger, such as 0.5 or larger, e.g. 0.6.

The resistor may be switchable between N different electrical resistance values, N being an integer larger than two, and the electric device may further comprise a read out circuit for determining the resistance value. The read out circuit may be able to discriminate between two resistance values having a relative resistance difference larger than or equal to a minimum detectable relative resistance difference, $(dR/R)_{min}$. The ratio $k=R_{fr}/R_{cr}$ of the further resistance $R_{fr}$ over the minimum resistance $R_{cr}$ of the layer of the phase change material may satisfy $k/[(1+k)(N-1)]>(dR/R)_{min}$. In this case a reliable readout of the N different resistance values may be achieved.

A preferred lower limit of k may be determined based on the minimum difference $dR=R_i-R_{i-1}$, i being an integer between 2 and N, between two adjacent electrical resistance values $R_i-R_{i-1}$ which may still be measured reliably. If k is too small the further resistance $R_{fr}$ of the further resistor is so small that it effectively determines the total resistance R of both the layer of phase change material and the further resistance. A change of the resistance of the layer of phase change material then results in a change of the total resistance which is too small to be measured reliably.

The preferred lower limit of k may be determined from the relation $k/((1+k)*(N-1))>(dR/R)_{min}$ where $(dR/R)_{min}$ is the minimum detectable relative resistance difference defined above. When satisfying this condition for the lower limit of k, this condition has to be met particularly for the difference between the two largest resistance values, i.e. for $R_N=R_{max}$, which is the largest value of the total resistance R of both the layer of phase change material and further resistor, and $R_{N-1}$. $R_{max}$ may be obtained when the entire length $l_{tot}$ in FIG. 2B is amorphous. The number N of different resistance values may be e.g. 2 or 4, which for $(dR/R)_{max}=0.3$, and the example of FIG. 2B results in the preferred condition k>0.4 or 9, respectively. For N=4, i.e. for two bits, $9\leq k \leq 19$ may preferably hold in this example. k may be e.g. equal to 13. The total resistance R of the layer of phase change material and the further resistor then is 2.5, 13.2, 24.0 and 34.7 kOhm for the four different states in the above example. The length l of the amorphous part increases by a constant amount $dl=l_i-l_{i-1}/l_{tot}=l_{tot}/4$ in this example. The relative difference between two adjacent states $dR/R_{i=1\ldots 4}$ decreases with increasing i. For the above example $(R_2-R_1)/R_2=0.81$, whereas $(R_4-R_3)/R_4=0.31$. This renders the readout of $R_3$ and $R_4$ more difficult than the readout of $R_1$ and $R_2$.

Instead of a constant increment dl for each two adjacent states, dl may depend on i such that $(R_{i+1}-R_i)/R_{i+1}$ is approximately constant. This has the advantage that the number of reliably readable resistance values is increased for the same minimum relative difference $(dR/R)_{min}$. For e.g. k=11.1, $dR_i=(R_i-R_{i-1})/R_i=0.3$ and in the example shown in FIG. 2B eight different resistance values $R_i$ may be realized when $dl_i$ depends on i to keep $dR_i/R_i$ constant instead of 4 different resistance values when dl is kept constant and $dR_i/R_i$ depends on i. Alternatively, the same number of, in this example four different, readable resistance values may be obtained with an increased relative resistance change $(R_{i+1}-R_i)/R_{i+1}$, which results in a more stable readout of the resistance value.

In an embodiment the phase change material constitutes a conductive path between a first contact area and a second contact area, a cross-section of the conductive path being smaller than the first contact area and the second contact area. Here, the term "contact area" defines the area in which the phase change material is electrically connected in series to an electrical conductor, such as the first conductor or the second conductor, which is composed of a material other than the phase change material. In the known device the phase change material is located on top of an aperture the side walls of which are provided with the first conductor. The first contact area is smaller than the cross section of the conductive path inside the layer of phase change material. The second conductor is connected to the layer of phase change material in a second contact area which is larger than the first contact area and which is equal to the cross section of the layer of phase change material. In the known device the phase change occurs in a volume of the phase change material which comprises the first contact area. At the interface, i.e. at this contact area, repetitive phase changes and the corresponding high current densities may cause a deterioration of the material, which may lead to a deterioration of the electric device, in particular when the phase change material comprises relatively reactive atoms such as Te. In the electric device according to this embodiment of the invention, the minimum cross section of the conductive path is well inside the phase change material and not, like in the known electric device, at the first contact area. The current density is then highest inside the phase change material and, therefore, the Joule heating is more effective inside the phase change material. This reduces the interactions between the phase change material and the other materials at the interface, i.e. at the first contact area and/or the second contact area, leading to an improved endurance.

In an embodiment, a part of the conductive path having the cross section constitutes a volume of phase change material, the volume having an electrical resistance which is larger than an electrical contact resistance at the first contact area and/or at the second contact area, irrespective of whether the phase change material is in the first phase or the second phase. In such an electric device the Joule heating at the first contact area and/or at the second contact area are each smaller than the Joule heating inside the volume of the phase change material where the current density is high. This further reduces the interactions between the phase change material and the other materials at the first contact area and/or the second contact area, leading to an improved endurance. An additional advantage is that the electrical power is dissipated, i.e. converted to heat, mainly at the location where the phase change occurs. By reducing the dissipation at positions where the phase change does not occur, the total electrical power required for inducing a phase transition is reduced.

Preferably, the electrical resistance of the volume is larger than the electrical contact resistance at both the first contact area and the second contact area, irrespective of whether the phase change material is in the first phase or the second phase. In this case, it is assured that the phase change occurs in the volume, which is inside the phase change material.

Preferably, the contact resistance at the first contact area and at the second contact area are smaller than $10^{-7}$ V cm$^2$/A because then the dissipation at the first contact area and at the second contact area is relatively small.

Preferably, the electric device according to the invention comprises a phase change material with a crystallization speed of at least 1 m/s. For changes of the amorphous phase having dimensions of the order of 10 to 20 nm, this results in a switching time of 10 to 20 ns or less, which allows for relatively fast operation of the electric device.

In an embodiment, the phase change material is a composition of formula $Sb_{1-c}M_c$, with c satisfying $0.05 \leq c \leq 0.61$, and M being one or more elements selected from the group of Ge, In, Ag, Ga, Te, Zn and Sn. Optionally, the material may comprise relatively small amounts, e.g. less than 5 atomic percent, of other elements such as, e.g., As, S, Se, which do not significantly change the crystallization and the electrical breakdown behavior.

The electric device according to this aspect of the invention has the additional advantage that the breakdown voltage required for switching from the high resistive amorphous state to the low resistive crystalline phase is lower than that of the known electric device. This is particularly advantageous when using advanced transistors to switch the electric device, because the advanced transistors have smaller dimensions and are therefore able to provide only a relatively small voltage. The inventors have established that the breakdown voltage scales approximately with the band gap of the phase change material in the amorphous state, and that the band gap decreases with increasing Sb amount. Preferably, the phase change material comprises at least 50 atomic percent of Sb. It is further preferred that the phase change material comprises at least 10 atomic percent of one or more elements M, because in this way the stability of the amorphous phase is increased and the phase change material in the amorphous phase may be subjected to relatively high temperatures before significant spontaneous re-crystallization occurs.

A further advantage of the electric device according to the invention resides in the fact that the resistivity of the crystalline phase is lower than that in the known electric device. Therefore, the ohmic losses in the crystalline phase are smaller than those in the known electric device, allowing for saving of power. Moreover, the contact resistance between the first conductor and the phase change material, and between the second conductor and the phase change material in the electric device according to the invention is lower than that in the known electric device. This allows the use of a smaller first contact area and/or second contact area, which for the electric device according to the invention results in a shorter switching time between the amorphous phase and the crystalline phase.

In the electric device according to the invention a smaller amount of Te may be used than in the known electric device. This has the advantage that the phase change material is less reactive, which improves the stability of the electric device. In particular, reactions at the interface between the phase change material and the conductors connected to it are reduced. In addition, the phase change material of the electric device according to this aspect of the invention has a relatively low vapor pressure due to the reduced Te amount, which allows for higher processing temperatures. Preferably, the phase change material is substantially free of Te.

Preferably, the one or more elements M comprise Ge and/or Ga. An electric device comprising a phase change material comprising Ge and/or Ga has the advantage that the crystallization temperature is relatively high and therefore the amorphous phase is stable up to relatively high temperatures. The crystallization temperature and thus the stability of the amorphous phase increases with increasing Ge and/or Ga concentration. Preferably, the phase change material comprises Ge and/or Ga at concentrations which in total are between 5 and 35 atomic percent, more preferably between 15 and 25 atomic percent. It is often preferred that the phase change material comprises less than 30 atomic percent of Ge because otherwise the crystallization temperature and the melting temperature are so high that a relatively high energy is required to induce a phase transition from the amorphous phase to the crystalline phase, and back. The crystallization speed decreases when increasing the total concentration of Ge and Ga. This dependence of the crystallization speed upon the Ge and/or Ga concentration may be used to adjust the crystallization speed.

Moreover, it is also preferred that the phase change material comprises less than 35 atomic percent of Ga, because at higher Ga concentrations the difference between the electric resistance in the amorphous phase and in the crystalline phase is relatively small, which may lead to errors when measuring the resistance. Preferably, the phase change material comprises less than 25 atomic percent of Ga.

In one embodiment, the phase change material comprises In and/or Sn. Preferably, the phase change material comprises In and/or Sn in concentrations which in total are between 5 and 30 atomic percent. A phase change material comprising In and/or Sn has a relatively high crystallization speed and a relatively low melting temperature, which implies that a relatively low energy is required for inducing the transition from the first phase to the second phase. It is often advantageous if the phase change material comprises in total between 15 and 25 atomic percent of In and/or Sn. Preferably, the phase change material comprises approximately 20 atomic percent of these materials.

When the phase change material comprises in total more than 20 atomic percent of Ge and/or Ga, it is preferred that the phase change material further comprises one or more elements selected from In and Sn in concentrations below 30 atomic percent. The electric device according to this embodiment has a relatively high stability of the amorphous phase due to the presence of Ge and/or Ga, and a relatively low melting temperature due to the presence of one or more elements selected from In and Sn.

In a variation of this embodiment, the phase change material is a composition of formula $Sb_aTe_bX_{100-(a+b)}$ with a, b and 100−(a+b) denoting atomic percentages satisfying $1 \leq a/b \leq 8$ and $4 \leq 100-(a+b) \leq 22$, and X being one or more elements selected from the group of Ge, In, Ag, Ga, Zn and Sn. Adding the latter element has the advantage that the phase change material has a relatively high crystallization speed. Optionally, the material may comprise relatively small amounts, e.g. less than 5 atomic percent, of other elements such as, e.g., As, S, Se, which do not significantly change the crystallization and the electrical breakdown behavior.

It is advantageous if the element X comprises Ge. An electric device comprising a phase-change material comprising Ge has the advantage that the crystallization temperature is relatively high and therefore the amorphous phase is stable up to relatively high temperatures.

In an embodiment, the phase-change material comprises more than 10 atomic percent and less than 22 atomic percent of Ge. In this case the crystallization temperature of the phase-change material is between 180 and 250 degrees Celsius. When the crystallization temperature is lower than 180 degrees Celsius, the stability of the amorphous phase may be insufficient, in particular when the electric device may be subjected to relatively high temperatures. When the crystallization temperature is higher than 200 degrees Celsius such as, e.g., 250 degrees Celsius, a relatively high switching power is required to induce a phase transition from the amorphous phase to the crystalline phase.

It is advantageous if the first contact area is smaller than or equal to the second contact area, the first contact area having a characteristic dimension d (in nm), $6 \cdot a/b$ being smaller than d. This embodiment of the invention is based on the following insight: in order to be able to perform a phase transition from the crystalline phase to the amorphous phase, it is required that the cooling time, i.e. the time in which the phase change material cools down to a temperature below the crystallization temperature, is smaller than the crystallization time, i.e. the time required for a transition from the amorphous phase back to the crystalline phase. If this condition is not met, the melted amorphous material re-crystallizes during cooling down, resulting in the same phase as before the heating, i.e. the phase transition from the crystalline phase to the amorphous phase is not possible. Calculations by the inventors show that typical cooling times are of the order of 2 ns. The minimal crystallization time should be larger than the cooling time, preferably at least two times larger or even at least three times larger. The crystallization time $t_{cr}$ may be 5 ns or longer, such as 6 ns or longer, such as 10 ns or longer. Since the crystallization speed $v_{cr}$ for the phase change material, being a composition of formula $Sb_aTe_bX_{100}-(a+b)$ described above, is approximately equal to a/b, we find $v_{cr} \approx a/b < d/t_{cr} \approx d/6$ when $t_{cr}$ is set to 6 ns.

It is advantageous if the volume of the phase change material undergoing the phase change has a characteristic dimension d (in nm), $6 \cdot a/b$ being smaller than d.

For the phase change material of the electric device according to the invention the crystallization starts at the interface between the amorphous phase and the crystalline phase. Therefore, the crystallization time is given by the characteristic dimension of the amorphous volume divided by the crystallization speed. Here, the characteristic dimension is the largest distance between the point which is the last to crystallize and the interface between the amorphous phase and the crystalline phase at the start of the phase transition. When N different equidistant resistance values may be stored, $6 \cdot a/b$ may be smaller than d/N, where d is in nm.

When the phase change is induced mainly by Ohmic heating at the contact area, this dimension may be approximated by the characteristic dimension of this contact area. This may be the first contact area provided that the first contact area is not larger than the second contact area. When the phase change occurs inside the layer of phase change material, i.e. away from the first contact area and the second contact area, the characteristic dimension d is the length of the largest amorphous part, such as e.g. the length $l_{tot}$ shown in FIG. 2B.

The inventors have determined the cooling time from simulations and the crystallization speed as a function of the composition of the phase change material from experiments. Using the results of these simulations and measurements combined with the above-described criterion, it can be shown that $6 \cdot a/b$ has to be smaller than d, where d is in nm, in order to prevent complete re-crystallization during cooling down of the amorphous phase. In some cases, where the phase change occurs at an interface between the phase change material and the first conductor, the characteristic dimension of the amorphous phase change volume extends beyond the first contact area, the amorphous phase having approximately twice the size of the first contact area. The requirement may then be relaxed to $3 \cdot a/b$ being smaller than d, where d is in nm. In this case a first contact area with a two times smaller surface area may be used.

In an embodiment of the electric device according to the invention the first conductor, the second conductor, the resistor and the layer constitute a memory element, and the body comprises an array of memory cells, each memory cell comprising a respective memory element and a respective selection device, and a grid of selection lines, each memory cell being individually accessible via the respective selection lines connected to the respective selection device.

Such an electric device may be used as a non-volatile, electrically writable, electrically readable and electrically erasable memory. Because each memory cell comprises a selection device, individual memory elements may be conveniently selected for reading, i.e. for measuring the value of the electrical resistance, and for writing and erasing, i.e. for inducing a transition from a first phase to a second phase.

The memory elements of the present invention may be electrically coupled to selection devices and to selection lines in order to form a memory array. The selection devices permit each discrete memory cell to be read and written without interfering with information stored in adjacent or remote memory cells of the array. Generally, the present invention is not limited to the use of any specific type of selection device. Examples of selection devices include field-effect transistors, bipolar junction transistors, and diodes such as known from, e.g., WO-A 97/07550. Examples of field-effect transistors include JFET and metal oxide semiconductor field effect transistors (MOSFET) such as known from, e.g., WO-A 00/39028. Examples of MOSFET include NMOS transistors and PMOS transistors. Furthermore, NMOS and PMOS may even be formed on the same chip for CMOS technologies.

Usually, such types of electric devices are as compact as possible, which implies that the mutual distance between adjacent resistors is small. In these electric devices comprising a dielectric material according to the invention, crosstalk is reduced.

In one embodiment the selection device comprises a MOSFET having a source region, a drain region and a gate region, and the grid of selection lines comprises N first selection lines, M second selection lines, N and M being integers, and an output line, the first conductor of each memory element being electrically connected to a first region selected from the source region and the drain region of the corresponding metal oxide semiconductor field effect transistor, the second conductor of each memory element being electrically connected to the output line, a second region of the corresponding metal oxide semiconductor field effect transistor, which is selected from the source region and the drain region and which lies free from the first region, being electrically connected to one of the N first selection lines, the gate region being electrically connected to one of the M second selection lines.

In this type of device the resistor may be conveniently integrated with the selection device.

Figure 3:
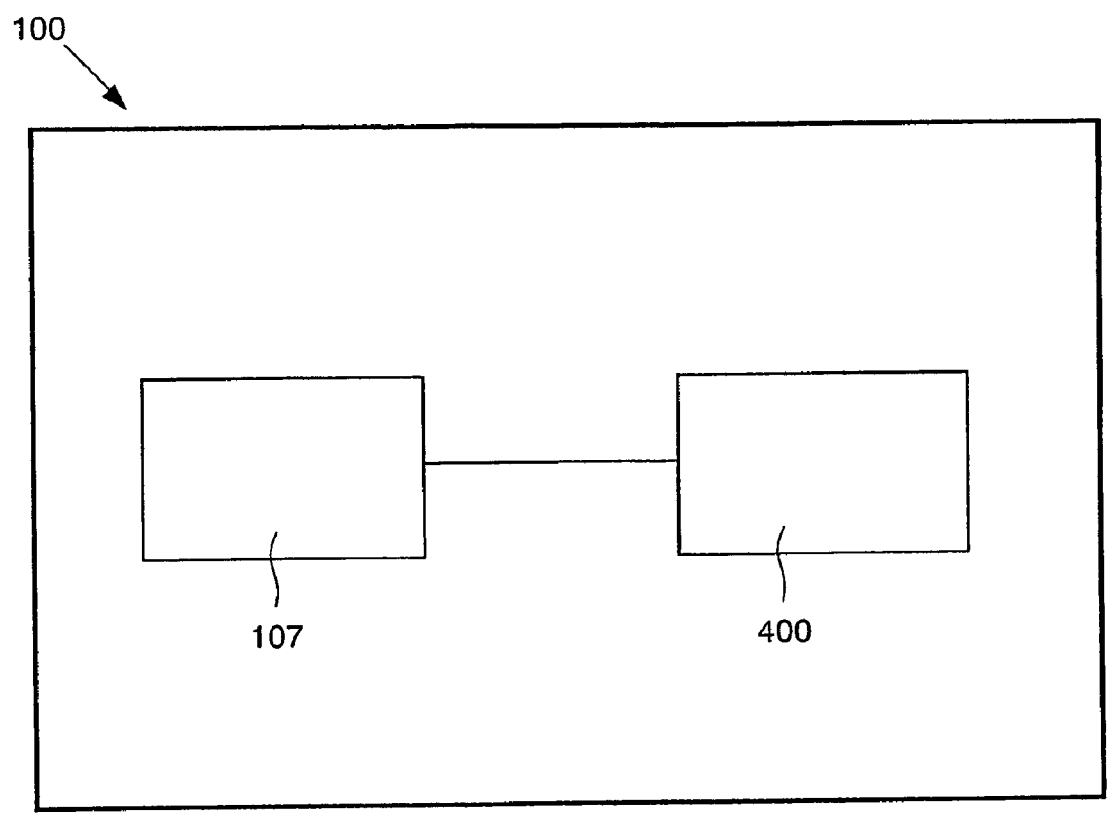
Figure 4:
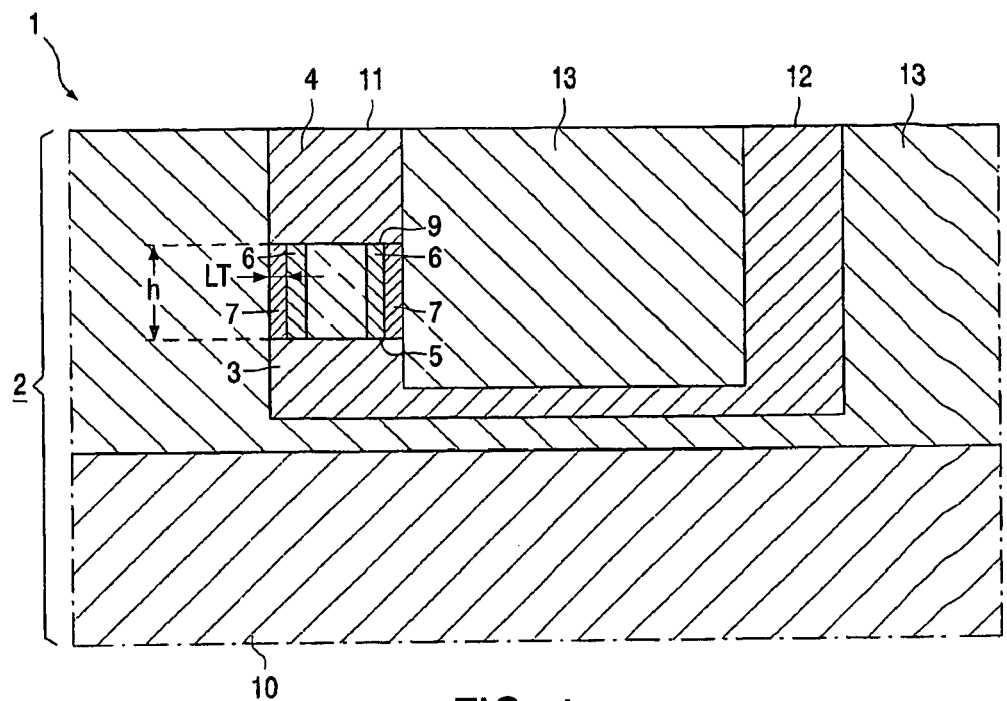
Figure 6:
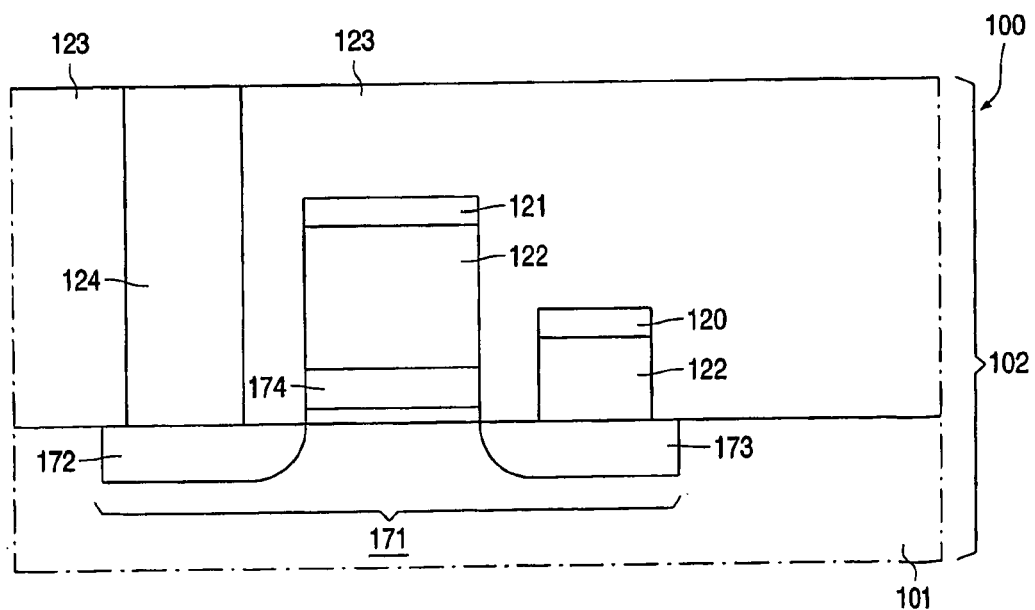
Figure 5:
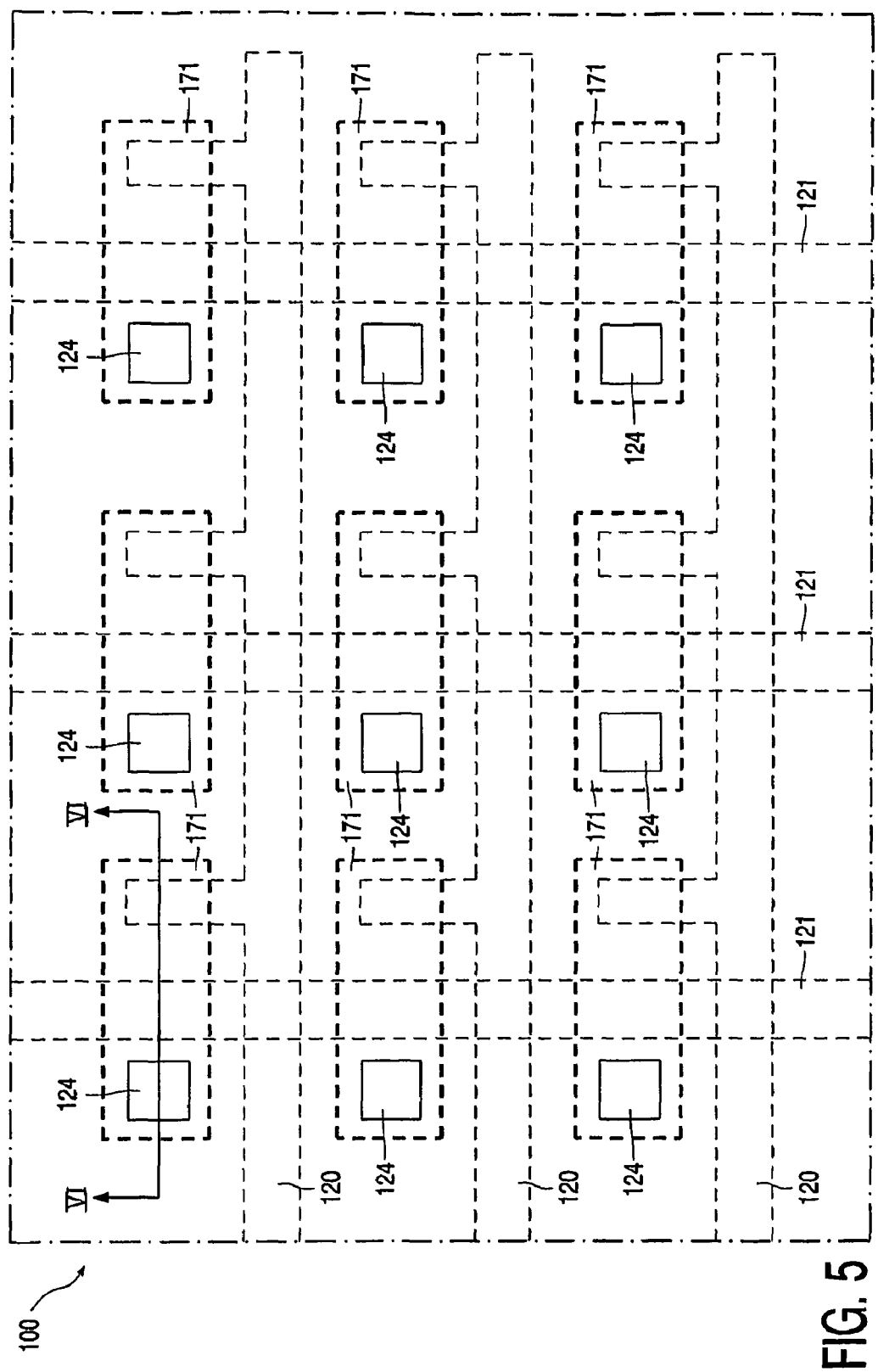
Figure 7:
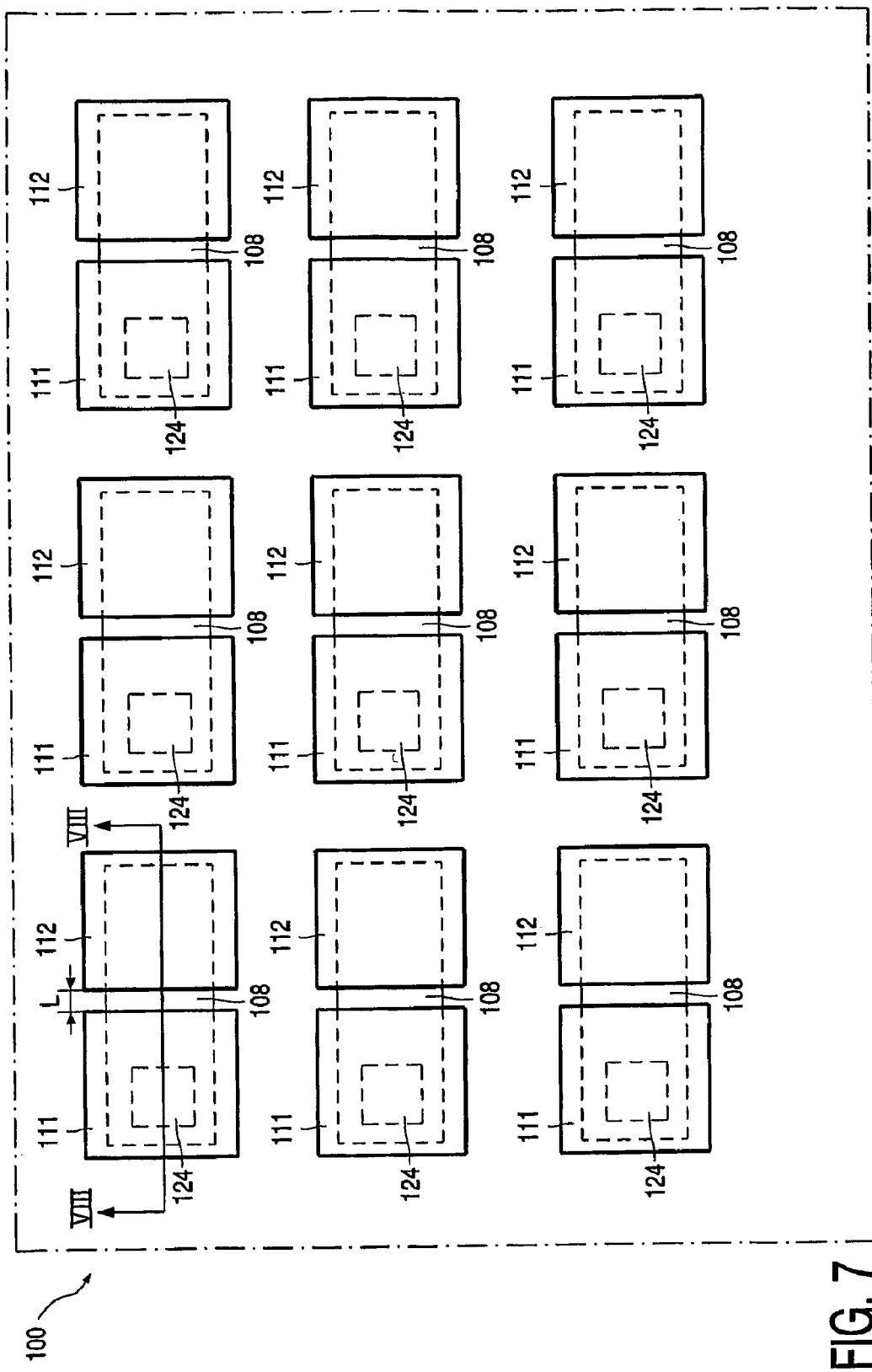
Figure 8:
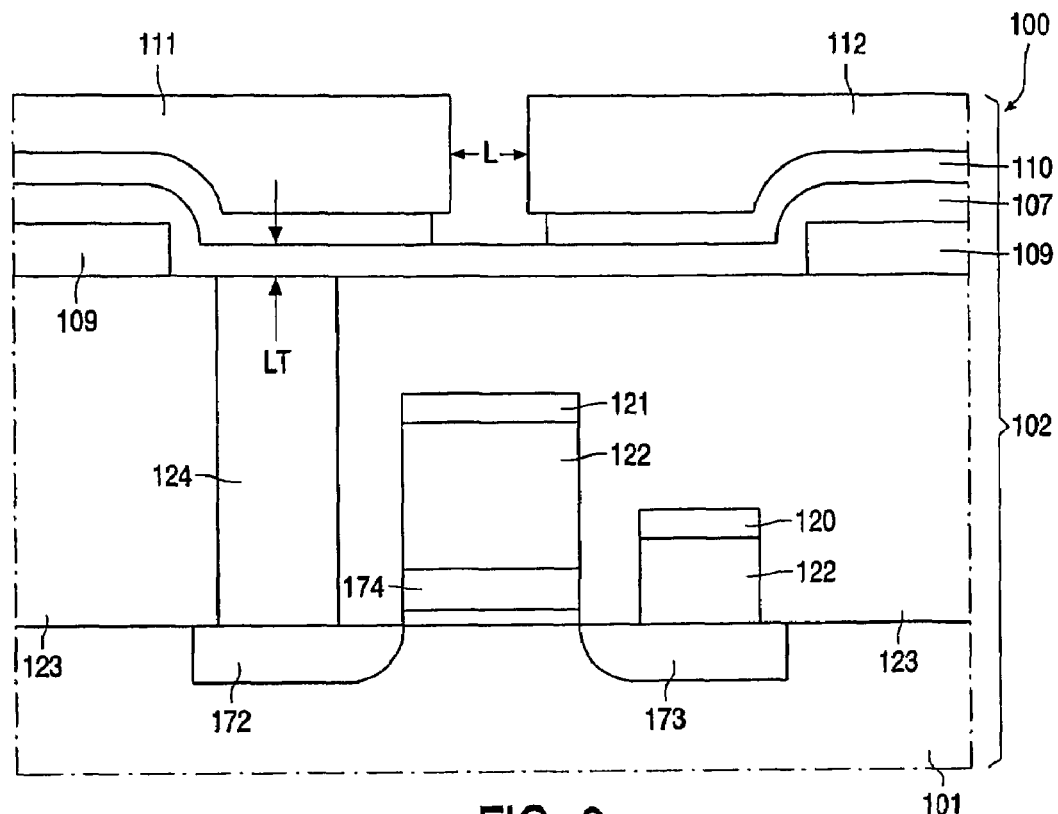
Figure 10:
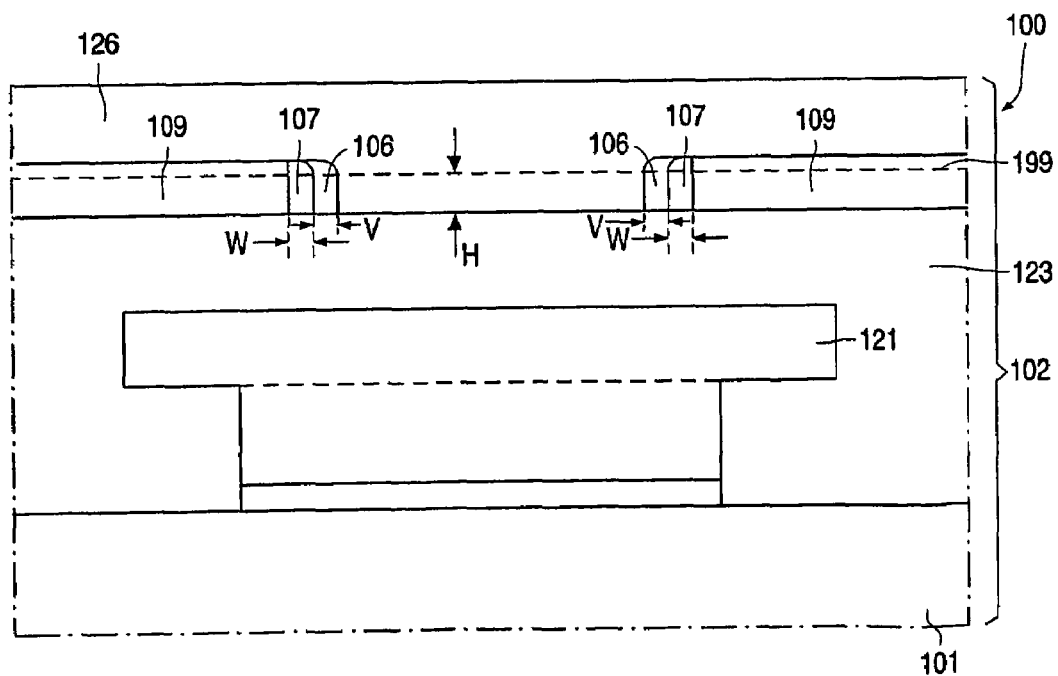
Figure 9:
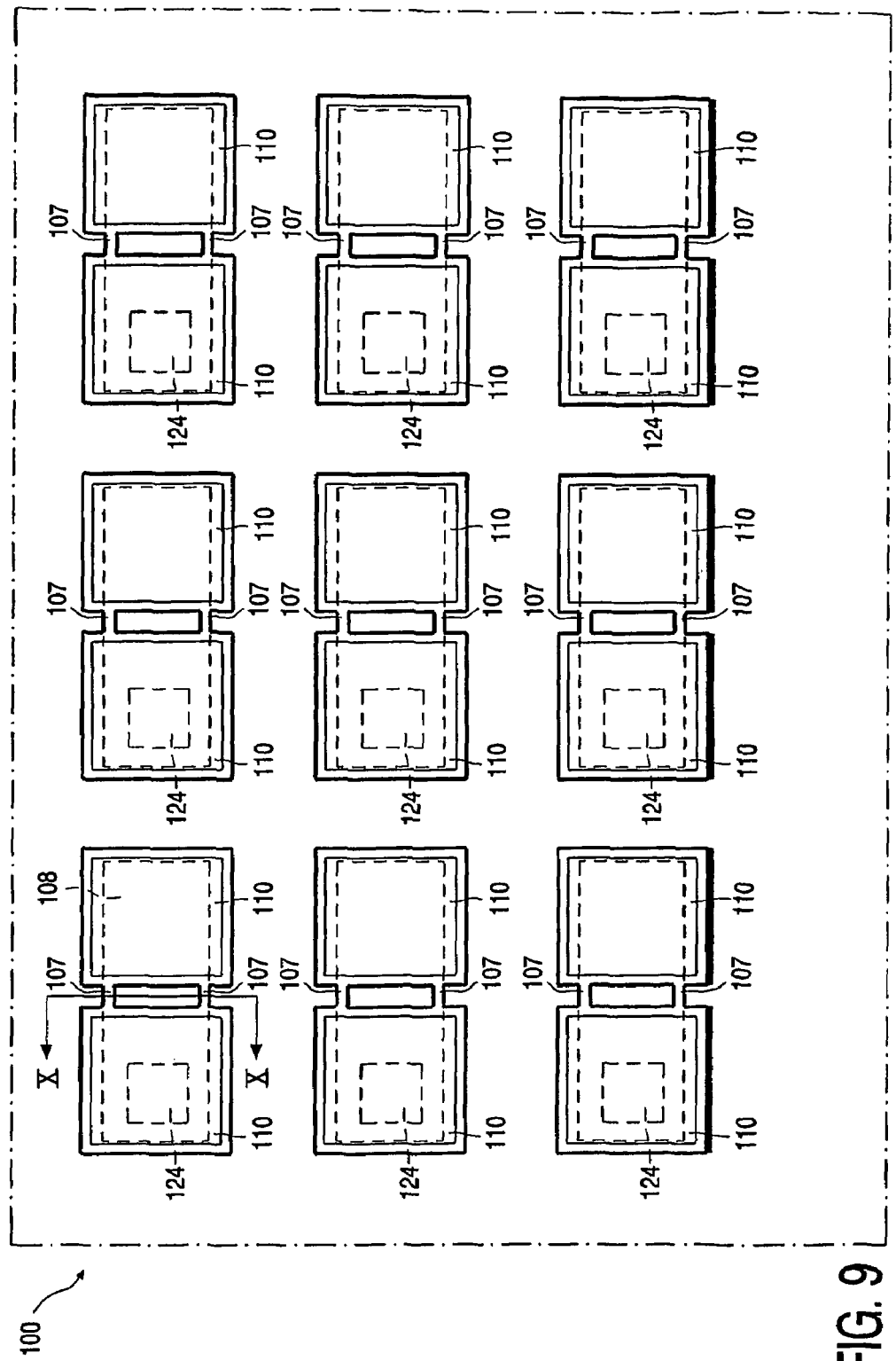
Figure 11:
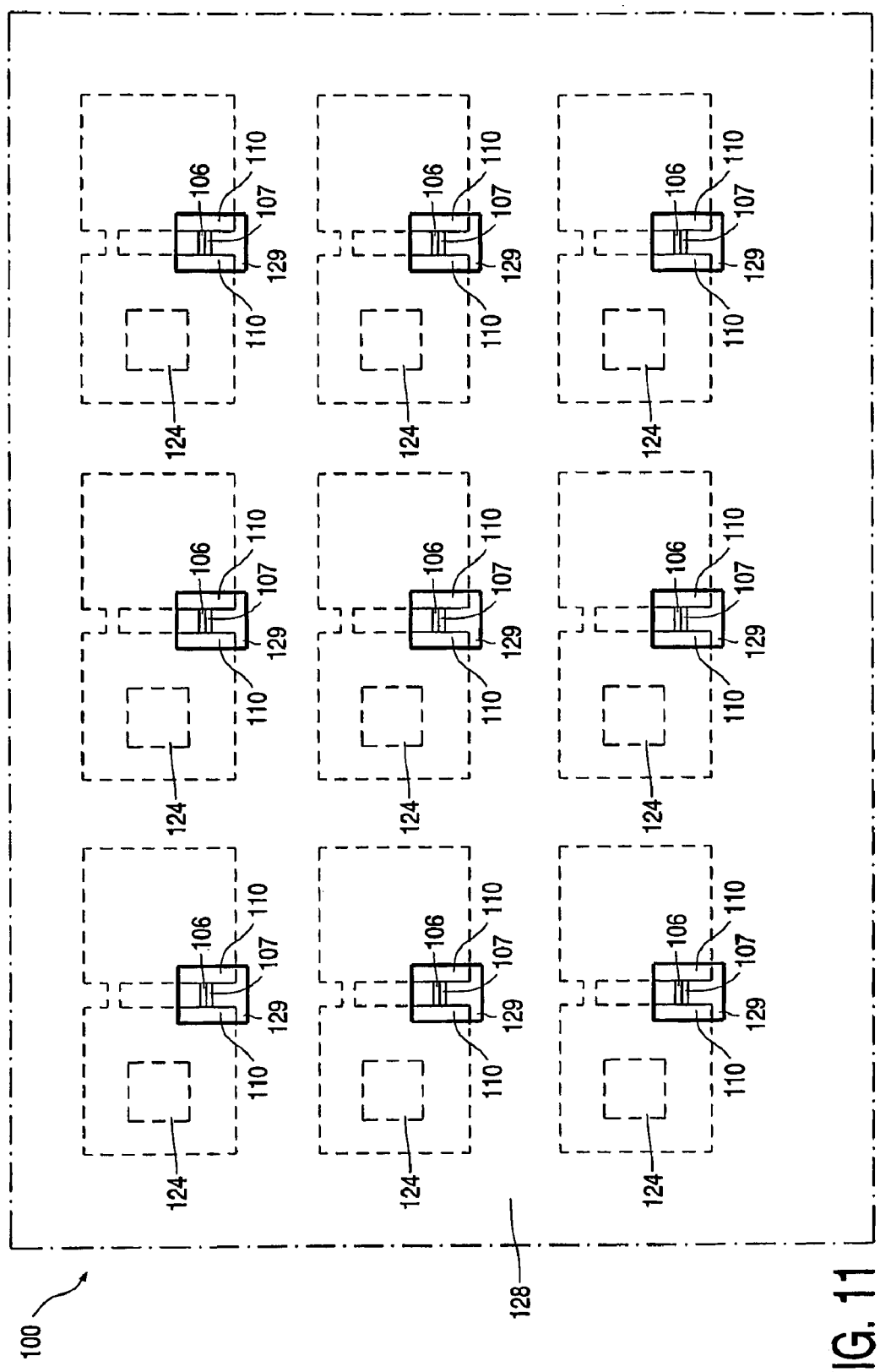
Figure 12:
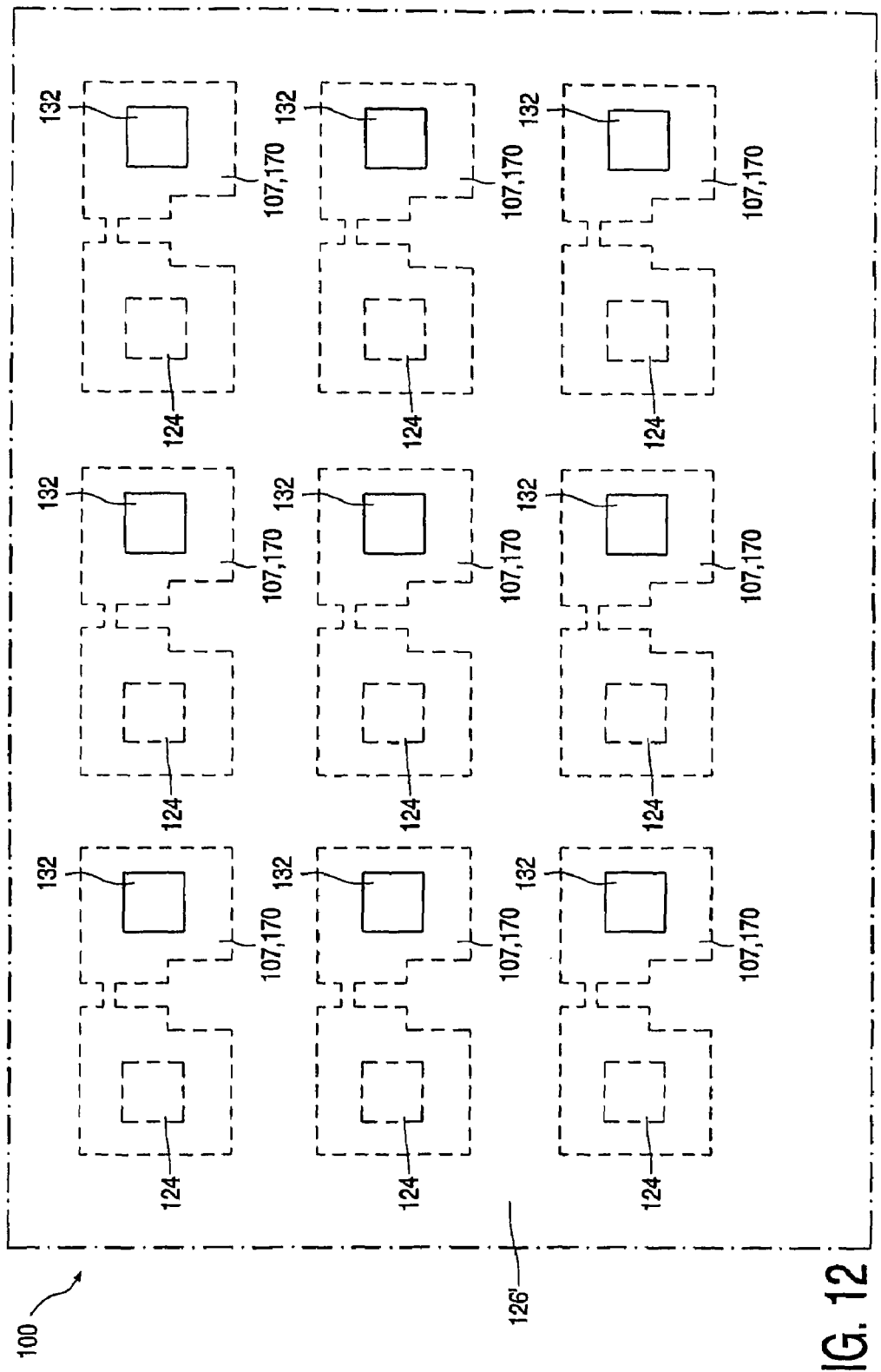
Figure 13:
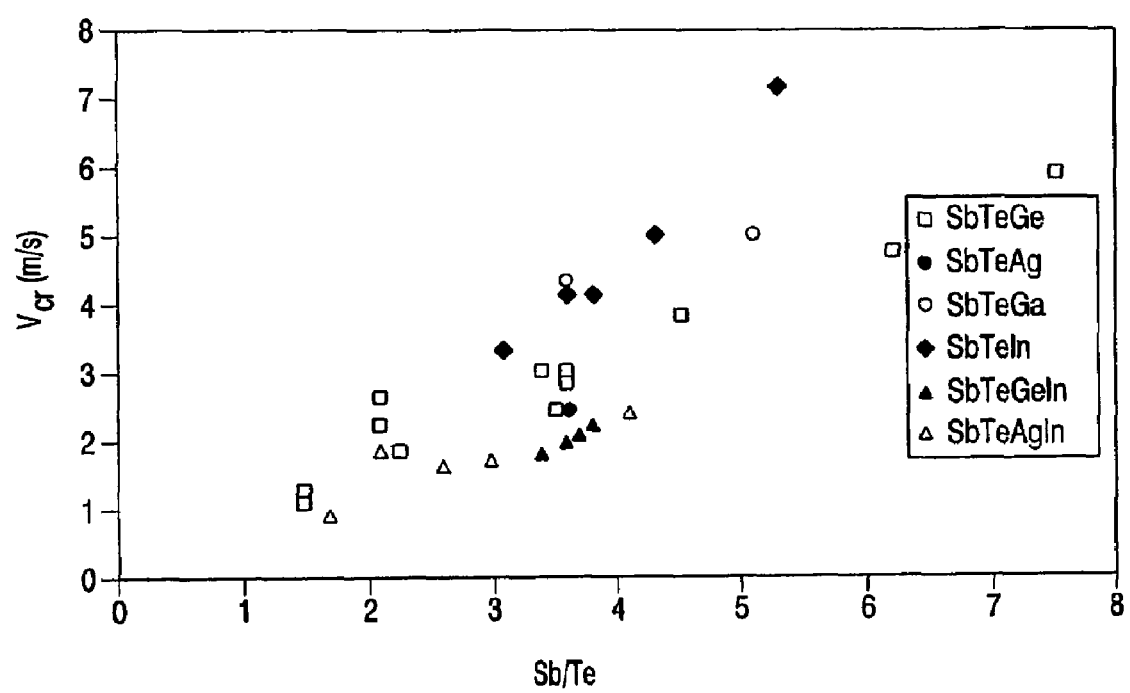
Figure 15A:
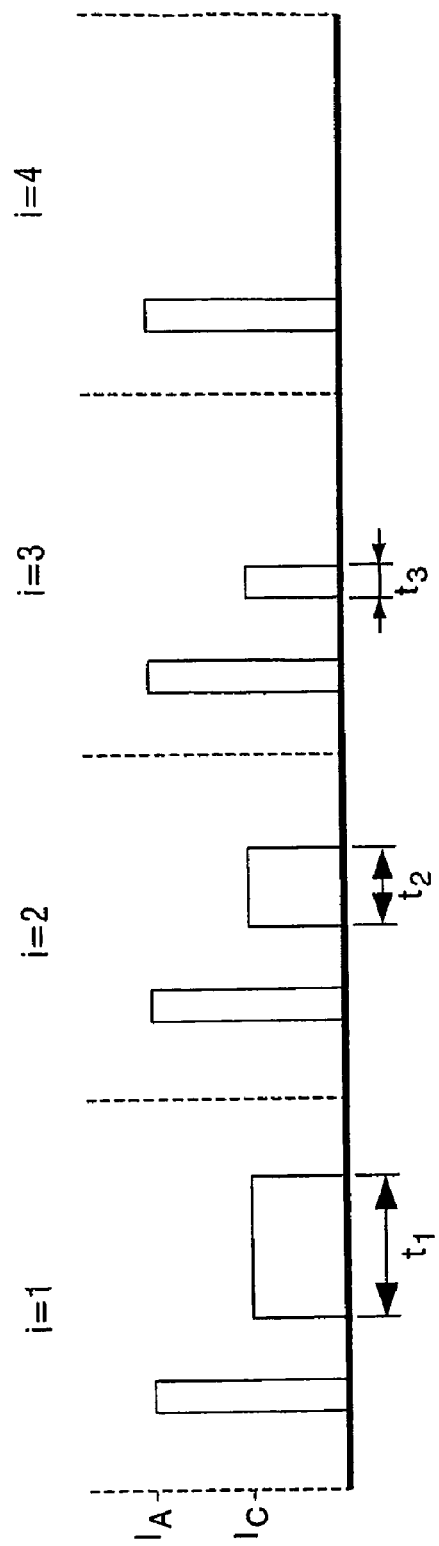
Figure 15B:
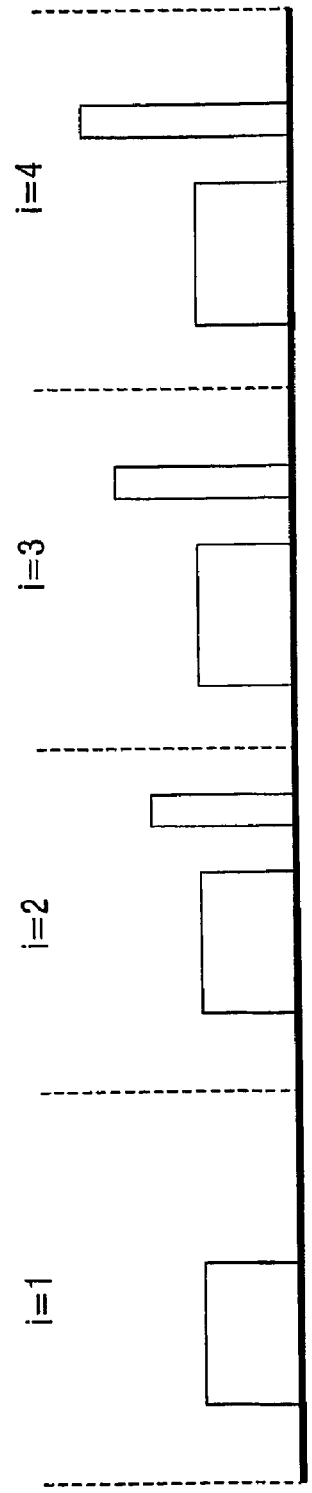
Figure 16A:
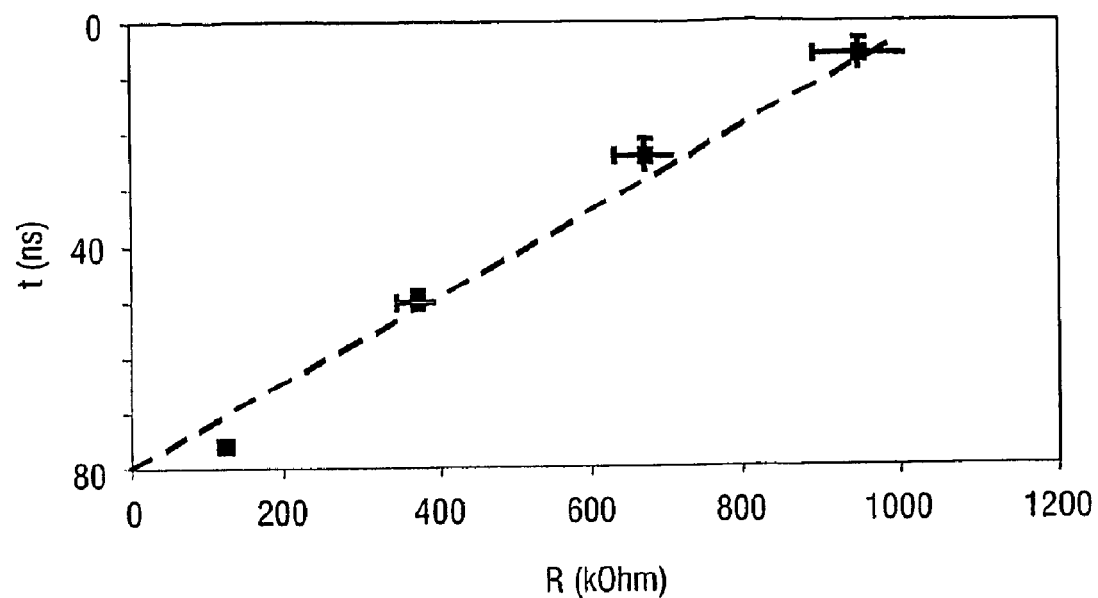
Figure 16B:
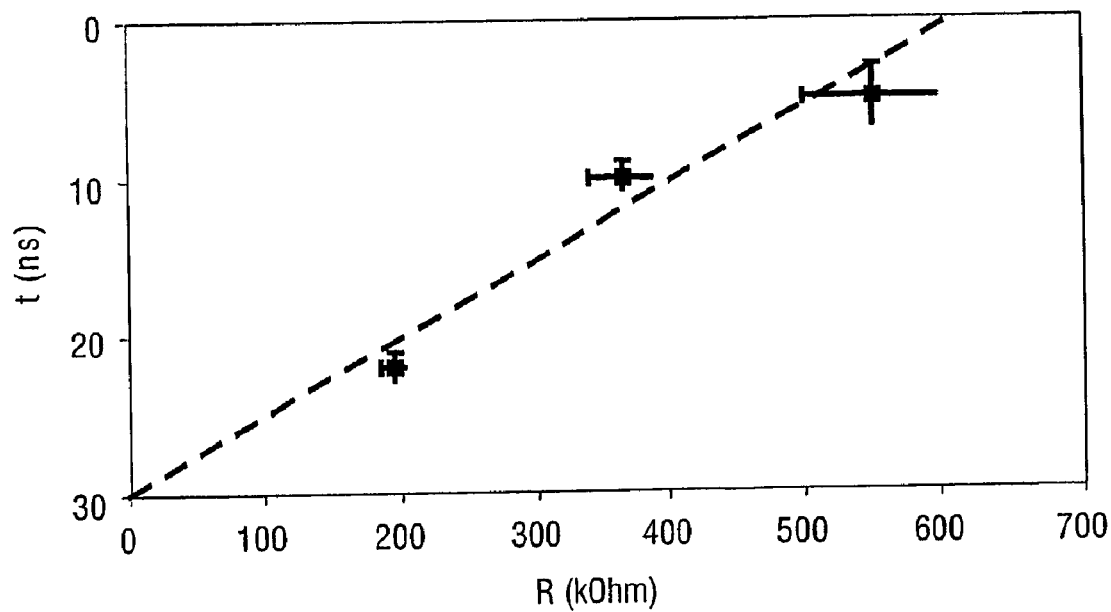

These and other aspects of the electric device according to the invention will be further elucidated and described with reference to the drawings, in which:

FIGS. 1A and 1B schematically depict the nucleation growth mechanism and the fast growth mechanism, respectively, FIGS. 2A and 2B show the resistance of a layer of phase change material in contact with a further resistor as a function of the length of the amorphous phase for various values of k, and a schematic cross section of the corresponding part of an electric device, FIG. 3 schematically shows an embodiment of the electric device, FIG. 4 is a schematic cross section of a part of the electric device comprising the layer of phase change material, FIG. 5 is a top view of a part of another embodiment of the electric device at a first stage of the manufacturing, FIG. 6 is a cross section of the part of the pre-fabricated electric device of FIG. 5 along line VI-VI, FIG. 7 is a top view of the part of the other embodiment of the electric device at a second stage of the manufacturing process, FIG. 8 is a cross section of the part of the pre-fabricated electric device of FIG. 7, taken along line VIII-VIII, FIG. 9 is a top view of the part of the other embodiment of the electric device at a third stage of the manufacturing process, FIG. 10 is a cross section of the part of the pre-fabricated electric device at a fourth stage, taken along line X-X of FIG. 9, FIGS. 11 and 12 are top views of the part of the other embodiment of the electric device at a fifth stage and a sixth stage of the manufacturing process, respectively, FIG. 13 is a plot of the crystallization speed as a function of the Sb/Te ratio, FIGS. 14A and 14B are a top view and a cross section taken along line XIV-XIV of FIG. 14A, respectively, of a part of another embodiment of the electric device, FIGS. 15A and 15B schematically show pulse sequences to set four different resistance values, and FIGS. 16A and 16B show experimentally determined resistance values as a function of the set pulse duration for two different materials.

The Figures are not drawn to scale.

The electric device 100 shown schematically in FIG. 3 has a resistor comprising a layer 107 of a phase change material being changeable between a first phase with a first electrical resistivity and a second phase with a second electrical resistivity different from the first electrical resistivity. The phase change material is a fast growth material examples of which are given in Table 1-3 below.

The electric device 100 further comprises a switching signal generator 400 able to generate an electrical signal by which the resistor may be switched between at least three different electrical resistance values by changing a corresponding portion of the layer of the phase change material from the first phase to the second phase. Examples of the switching signal generator 400 and of the electrical signal will be discussed below with reference to FIGS. 15A and 15B. The signal generator 400 may further comprise a read signal generator for providing an electric read signal to the resistor. It may further comprise a read circuit for determining the resistance value from the electric read signal.

In the embodiment shown in FIG. 4, a part 1 of the electric device 100 is depicted which comprises the layer 7 of phase change material. The layer 7 of phase change material constitutes the resistor and a portion of the layer 7 of phase change material is in direct contact with a further resistor 6 arranged in parallel with the resistor. The further resistor 6 has the advantage that the total resistance of the resistor and the further resistor 6 remains relatively small, and thus small enough to allow for easy measuring, even when a relatively large portion of the layer 7 of the phase change material is in the amorphous phase. This advantage has been explained in more detail hereinabove with reference to FIG. 2. In another embodiment, not shown, the further resistor 6 is omitted.

The part 1, shown in FIG. 4, has a body 2 which comprises a substrate 10 which may comprise, e.g., a single crystal p-doped silicon semiconductor wafer. On a main surface of the substrate 10 the resistor is embedded in a dielectric 13, e.g., silicon oxide. The resistor is constituted by a layer 7 of a phase change material being changeable between a first phase with a first electrical resistivity and a second phase with a second electrical resistivity different from the first electrical resistivity.

In one embodiment the phase change material is a composition of formula $Sb_{1-c}M_c$ with c satisfying $0.05 \leq c \leq 0.61$, and M being one or more elements selected from the group of Ge, In, Ag, Ga, Te, Zn and Sn. Preferably, c satisfies $0.05 \leq c \leq 0.5$. Even more preferably, c satisfies $0.10 \leq c \leq 0.5$. A group of advantageous phase change materials has one or more elements M other than Ge and Ga in concentrations which in total are smaller than 25 atomic percent and/or comprise in total less than 30 atomic percent of Ge and/or Ga. Phase change materials comprising more than 20 atomic percent of Ge and Ga and one or more elements selected from In and Sn in concentrations which in total are between 5 and 20 atomic percent have a relatively high crystallization speed and at the same time a relatively high stability of the amorphous phase.

The phase change materials, being a composition of formula $Sb_{1-c}M_c$ with c satisfying $0.05 \leq c \leq 0.61$, and M being one or more elements selected from the group of Ge, In, Ag, Ga, Te, Zn and Sn, have crystallization temperatures, shown in Table 1, which are typically 50-100° C. higher than those of the compositions near the GeTe—$Sb_2Te_3$ tie-line, Additional advantages of these materials are that the crystallization temperature is relatively high and that the sheet resistance of the crystalline phase is substantially independent of the temperature for temperatures up to 400° C.

TABLE 1

Crystallization temperature for various compositions of the phase change material.

| Compound | $T_c$ (as deposited amorphous) (° C.) | $T_c$ (amorphous mark in crystalline layer) (° C.) |
|---|---|---|
| $Ga_{10}Sb_{90}$ | 210 | 165 |
| $Ga_{17}Sb_{83}$ | 233 | 210 |
| $Ga_{30}Sb_{70}$ | 251 | |

TABLE 1-continued

Crystallization temperature for various compositions of the phase change material.

| Compound | $T_c$ (as deposited amorphous) (° C.) | $T_c$ (amorphous mark in crystalline layer) (° C.) |
|---|---|---|
| $Ge_{12}Sb_{88}$ | 235 | 154 |
| $Ge_{15}Sb_{85}$ | 250 | 208 |
| $Ge_{22}Sb_{78}$ | 271 | 246 |
| $Ge_{30}Sb_{70}$ | 281 | |
| $Ge_5In_{20}Sb_{85}$ | 200 | 134 |
| $Ga_{20}In_{15}Sb_{65}$ | 215 | 190 |
| $Ge_{15}Sn_{20}Sb_{65}$ | 212 | 180 |

The phase change materials, being a composition of formula $Sb_{1-c}M_c$ with c satisfying $0.05 \leq c \leq 0.61$, and M being one or more elements selected from the group of Ge, In, Ag, Ga, Te, Zn and Sn, have a sheet resistance R which changes by at least two orders of magnitude upon crystallization.

TABLE 2

Examples of the phase change material, being a composition of formula $Sb_{1-c}M_c$ with c satisfying $0.05 \leq c \leq 0.61$, and M being one or more elements selected from the group of Ge, In, Ag, Ga, Zn and Sn.

| c | M | composition |
|---|---|---|
| 0.15 | Ge | $Sb_{85}Ge_{15}$ |
| 0.15 | In | $Sb_{85}In_{15}$ |
| 0.15 | Ga | $Sb_{85}Ga_{15}$ |
| 0.12 | Ge | $Sb_{88}Ge_{12}$ |
| 0.22 | Ge | $Sb_{78}Ge_{22}$ |
| 0.15 | In, Ga | $Sb_{85}In_{10}Ga_5$ |
| 0.08 | Ge | $Sb_{92}Ge_8$ |
| 0.1 | Ga | $Sb_{90}Ga_{10}$ |
| 0.15 | In, Ge | $Sb_{85}In_{10}Ge_5$ |
| 0.15 | In, Ga | $Sb_{85}In_{7.5}Ga_{7.5}$ |
| 0.2 | In | $Sb_{80}In_{20}$ |
| 0.35 | Ge, Sn | $Sb_{65}Ge_{15}Sn_{20}$ |
| 0.55 | Ge, Sn | $Sb_{45}Ge_{25}Sn_{30}$ |
| 0.3 | Ge | $Sb_{70}Ge_{30}$ |
| 0.3 | Ga | $Sb_{70}Ga_{30}$ |
| 0.5 | Ga, Sn | $Sb_{50}Ga_{25}Sn_{25}$ |
| 0.5 | In, Ge | $Sb_{51}In_{20}Ge_{29}$ |
| 0.35 | Zn, Ge, In | $Sb_{65}Ge_{20}In_{10}Zn_5$ |
| 0.35 | Ag, Ge, In | $Sb_{65}Ge_{20}In_{10}Ag_5$ |
| 0.35 | In, Ge, Sn | $Sb_{65}Ge_{20}Sn_{10}In_5$ |

In an embodiment the phase change material is a composition of formula $Sb_aTe_bX_{100-(a+b)}$ with a, b and $100-(a+b)$ denoting atomic percentages satisfying $1 \leq a/b \leq 8$ and $4 \leq 100-(a+b) \leq 22$, and X being one or more elements selected from Ge, In, Ag, Ga and Zn. The phase change material may be, e.g., $Sb_{72}Te_{20}Ge_8$.

TABLE 3

Examples of the phase change material, being a composition of formula $Sb_aTe_bX_{100-(a+b)}$ with a, b and $100 - (a + b)$ denoting atomic percentages satisfying $1 \leq a/b \leq 8$ and $4 \leq 100 - (a + b) \leq 22$, and X being one or more elements selected from Ge, In, Ag, Ga and Zn. Ge, In, Ag and Ga denote the atomic percentage of these elements comprised in the phase change material, and Sb/Te denotes the ratio of the atomic percentage of Sb and Te.

| Sb/Te | Ge | In | Ag | Zn | Ga | composition |
|---|---|---|---|---|---|---|
| 3.6 | 8 | | | | | $Sb_{72}Te_{20}Ge_8$ |
| 1.7 | 15 | | | | | $Sb_{54}Te_{31}Ge_{15}$ |
| 1.5 | 15 | | | | | $Sb_{51}Te_{34}Ge_{15}$ |
| 1.7 | 10 | | | | | $Sb_{57}Te_{33}Ge_{10}$ |
| 3.6 | | | 8 | | | $Sb_{72}Te_{20}Ag_8$ |

TABLE 3-continued

Examples of the phase change material, being a composition of formula $Sb_aTe_bX_{100-(a+b)}$ with a, b and $100 - (a + b)$ denoting atomic percentages satisfying $1 \leq a/b \leq 8$ and $4 \leq 100 - (a + b) \leq 22$, and X being one or more elements selected from Ge, In, Ag, Ga and Zn. Ge, In, Ag and Ga denote the atomic percentage of these elements comprised in the phase change material, and Sb/Te denotes the ratio of the atomic percentage of Sb and Te.

| Sb/Te | Ge | In | Ag | Zn | Ga | composition |
|---|---|---|---|---|---|---|
| 3.6 | | | | | 8 | $Sb_{72}Te_{20}Ga_8$ |
| 5.1 | | | | | 8 | $Sb_{77}Te_{15}Ga_8$ |
| 3.6 | | 8 | | | | $Sb_{72}Te_{20}In_8$ |
| 4 | | 5 | | | | $Sb_{76}Te_{19}In_5$ |
| 4 | | 10 | | | | $Sb_{72}Te_{19}In_{10}$ |
| 3.6 | 6 | | | 2 | | $Sb_{72}Te_{20}Ge_6Zn_2$ |
| 3.6 | 6 | 2 | | | | $Sb_{72}Te_{20}Ge_6In_2$ |
| 3.6 | 2 | 7 | | | | $Sb_{72}Te_{19}Ge_2In_7$ |
| 3.6 | | 4 | | | 4 | $Sb_{72}Te_{20}Ga_4In_4$ |
| 3.3 | 1 | | | | 4 | $Sb_{73}Te_{22}Ge_1Ga_4$ |
| 3.3 | 2 | | | | 3 | $Sb_{73}Te_{22}Ge_2Ga_3$ |
| 6.7 | 8 | | | | | $Sb_{80}Te_{12}Ge_8$ |
| 8 | 10 | | | | | $Sb_{80}Te_{10}Ge_{10}$ |
| 4.5 | 11 | | | | | $Sb_{73}Te_{16}Ge_{11}$ |

The phase change material may be deposited by sputtering as descried in the article "Phase-change media for high-numerical-aperture and blue-wavelength recording" by H. J. Borg et al., Japanese Journal of Applied Physics, volume 40, pages 1592-1597, 2001.

The body 2 further has a further resistor 6 arranged in parallel with the resistor. In the embodiment of FIG. 4 the resistor and the further resistor 6 adjoin a first contact area 5 and a second contact area 9.

The further resistor 6 is composed of a material with a melting point higher than that of the phase change material. The melting point of the material of the further resistor 6 is preferably at least 100 degrees Celsius, more preferably at least 250 degrees Celsius, higher than that of the phase change material. Preferably, the material does not react with the phase change material. Preferably, the resistivity of the material of the further resistor is in the range of 0.1 to 10 cm mV/A. When the phase change material is selected from the class of $Sb_{1-c}M_c$ with c satisfying $0.05 \leq c \leq 0.61$, and M being one or more elements selected from the group of Ge, In, Ag, Ga, Te, Zn and Sn, the phase change material has a resistivity of approximately 0.2 to 0.8 cm mV/A and the resistivity of the material of the further resistor is preferably between 0.1 and 4 cm mV/A.

In an embodiment the material of the further resistor is of a composition $X_{100-(t+s)}Si_sY_t$, where t and s denote atomic percentages satisfying $t<0.7$ and $s+t>0.3$, and X comprises one or more elements selected from Ti and Ta, and Y comprises one or more elements selected from C and N. Preferably, X is substantially free from Ti because Ta is less reactive with the phase change material than Ti. Preferably, s is smaller than or equal to 0.7, because otherwise the conductivity of the parallel heater is relatively low, which requires a relatively large parallel heater. When the phase change material comprises Ge, mixing of Ge and Si are reduced when s is smaller than or equal to 0.7. It is further advantageous if Y comprises N, because the material of the further resistor usually has a polycrystalline structure which is stabilized by the nitrogen atoms, i.e. the polycrystalline structure is changed to a relatively small extent when heating the phase change material. Examples of this class of material of the further resistor are TaSiN, $Ta_{20}Si_{40}N_{40}$, TiSiN or $Ta_{20}Si_{40}C_{40}$. Alternatively, the material of the further resistor may be composed of TiN, TaSi$_2$, TaN$_x$, where x satisfies 0.3≦x≦0.7, TiAlN, TiC, TiWC or, e.g. p-, doped polycrystalline silicon.

The body 2 further comprises a first conductor 3 of, e.g., tantalum disilicide (TaSi$_2$) which is electrically connected to the first contact area 5, and a second conductor 4 of titanium nitride (TiN), which is electrically connected to the second contact area 9. In volumes relatively remote from the first contact area 5 and the second contact area 9, the first conductor 3 and the second conductor 4 may comprise a material of relatively good electrical conductivity such as, e.g., tungsten, aluminum or copper, to increase the electrical conductivity of the first conductor 3 and the second conductor 4. The first conductor 3 and the second conductor 4 have contact pads 11 and 12, respectively, which allow for conducting a current through the first conductor 3, the second conductor 4, the resistor and the further resistor 6.

In the embodiment shown in cross section in FIG. 4 the layer 7 is arranged at the inner surface of a contact hole in dielectric 13. The contact hole may have a cylindrical shape with a diameter d between 25 and 250 nm and a height h between 25 and 300 nm. The phase change material may be deposited by sputtering as described in the article "Phase-change media for high-numerical-aperture and blue-wavelength recording" by H. J. Borg et al., Japanese Journal of Applied Physics, volume 40, pages 1592-1597, 2001. Preferably, the phase change material has a layer thickness LT of 3 to 25 nm. The further resistor 6 is arranged at the inner surface of the contact hole after the contact hole has been provided with the phase change material. Preferably, the material of further resistor 6 has a layer thickness MT of 3 to 15 nm. In the embodiment shown in FIG. 4 the further resistor 6 and the layer 7 constituting the resistor are in direct contact.

In one embodiment the contact hole has a diameter d of 40 nm and a height h of 50 nm, the layer of phase change material is of composition Ge$_8$Sb$_{72}$Te$_{20}$ and has a layer thickness LT of 5 nm, the further resistor 6 is of composition Ta$_{20}$Si$_{40}$N$_{40}$ and has a layer thickness MT of 5 nm. It is arranged inside the contact hole as depicted in FIG. 4. The further resistor 6 has a further electrical resistance of approximately $R_{fr}$=1400 Ohm. In the crystalline phase and in the amorphous phase the layer 7 has an electric resistance of approximately $R_{cr}$=400 Ohm and of more than 100 kOhm, respectively. The ratio k=$R_{fr}/R_{cr}$ is 3.5. Thus, the further electrical resistance $R_{fr}$ of the further resistor is smaller than the maximum of the electrical resistance of the layer of phase change material. The further electrical resistance $R_{fr}$ is larger than 0.3 times the minimum of the electrical resistance of the layer of phase change material, which is equal to $R_{cr}$.

In another embodiment the geometrical dimensions of the contact hole, the phase change material and the further resistor 6 are the same but the latter is of composition Ta$_{40}$Si$_{50}$N$_{10}$. The further electrical resistance then is approximately 160 Ohm and thus smaller than 0.3 times the minimum of the first electrical resistance and the second electrical resistance.

In an alternative embodiment the layer 7 of phase change material and the further resistor 6 are interchanged, i.e. the further resistor 6 is provided to the inner surface of the contact hole and subsequently the layer 7 is provided on top thereof. In another embodiment, not shown, the further resistor 6 is separated from the resistor 7 by an intermediate layer which may comprise, e.g., silicon dioxide. The intermediate layer may be an insulator or an electric conductor. The intermediate layer may reduce and, preferably, prevent mixing of the phase change material with the material of the further resistor. Preferably, the thickness of the intermediate layer is small enough to have no significant influence on the heating efficiency of the Joule heating inducing the phase transition. Preferably, the thickness of the intermediate layer, i.e. the distance between the further resistor 6 and the layer 7 is less than 5 nm. Preferably, the thickness is between 1 and 3 nm. The intermediate layer may be composed of zinc sulfide quartz (ZnS—SiO$_2$) and/or silicon nitride. In another embodiment the further resistor 6 is omitted.

In another embodiment of the electric device 100, shown in FIGS. 5-12 at various stages of the manufacturing process, layer 107 of the phase change material constitutes a conductive path between a first contact area and a second contact area, a cross section of the conductive path being smaller than the first contact area and the second contact area.

The resistor comprising the layer 107 of phase change material constitutes a memory element 170, and the body 102 comprises a semiconductor substrate 101, which may comprise, e.g., a single crystal p-doped silicon semiconductor wafer, and an array of memory cells, each memory cell comprising a respective memory element 170 and a respective selection device 171. In the embodiment shown in FIGS. 5-12 the electric device 100 has a 3×3 array, but the invention is not limited to an array of this size nor to an array of this shape. The body 102 further comprises a grid of selection lines 120, 121 such that each memory cell is individually accessible via the respective selection lines 120, 121 connected to the respective selection device 171.

In the embodiment shown in FIGS. 5-12 the selection device 171 comprises a metal oxide semiconductor field effect transistor (MOSFET), and more specifically an NMOS transistor. The MOSFET has n-doped source regions 172, n-doped drain regions 173, and gate regions 174. The source regions 172 and the drain regions 173 may comprise more than one portion of n-doped material, namely a lightly doped n−portion and a more heavily doped n+ portion. The n-doped source region 172 and the drain region 173 are separated by a channel region. The gate regions 174, formed above the channel region, control the flow of current from the source region 172 to the drain region 173 through the channel region. The gate region 174 preferably comprises a layer of polycrystalline silicon. The gate region 174 is separated from the channel region by a gate dielectric layer.

The grid of selection lines 120, 121 comprises N=3 first selection lines 120 and M=3 second selection lines 121, and an output line. The resistor 107 of each memory element electrically connects a first region selected from the source region 172 and the drain region 173 of the corresponding MOSFET to the output line. A second region of the corresponding MOSFET selected from the source region 172 and the drain region 173 and lying free from the first region, is electrically connected to one of the N first selection lines 120. The gate region 174 is electrically connected to one of the M second selection lines 121. In the embodiment shown in FIGS. 5-12 the first region is the source region 172 and the second region is the drain region 173. In another embodiment, not shown, the first region is the drain region 173 and the second region is the source region 172. The selection lines 120, 121 are connected to line selection devices and row selection devices, respectively. These latter selection devices are not shown.

The gate region 174 and the drain region 173 are provided with layers of tungsten silicide and tungsten plugs 122 for electrically connecting the gate region 174 and the drain region 173 to the selection lines 121 and 120, respectively. The selection lines 120 and 121 are formed from a conductive material such as, e.g., aluminum or copper. The source region 172 is provided with a layer of tungsten silicide and a tungsten plug as well.

In a process of manufacturing the electric device 100, first the array of selection devices 171 and the grid of selection lines 120, 121 are formed, e.g. using standard IC technology. One terminal of each selection device 171, in the embodiment of FIGS. 5-12 the source region 172, is provided with an electrical conductor 124 such as, e.g., a tungsten plug. The selection device 171, the selection lines 120, 121 and the electrical conductor 124 are mutually insulated from each other by, and embedded in, a dielectric material 123, e.g. silicon dioxide, such that the electrical conductor 124 is exposed as shown in FIGS. 5 and 6. Preferably, the surface comprising the exposed electrical conductor 124 is polished by chemical mechanical polishing (CMP) for obtaining a smooth and plain surface.

In a subsequent step this surface is provided with a layer 109 of a dielectric material such as, e.g., silicon nitride or silicon carbide. In the layer 109 openings 108 are formed by means of, e.g., lithography, such that the electrical conductors 124 and parts of the dielectric 123 adjacent to the electrical conductors 124 are exposed as shown in FIG. 8. Subsequently, the layer 109 and the openings 108 of pre-fabricated electric device 100 thus obtained are provided with a layer 107 of phase change material as shown in FIG. 8. The phase change material may comprise any of the fast growth phase change materials of which resistor 7 of the electric device 1 described above is composed. The thickness LT of layer 107, which is typically 5-50 nm, preferably approximately 15 nm, determines the width of the minimal cross section of the phase change material, as will be described below. Onto the layer 107 a layer 110 of a conductive material such as, e.g., TiN may be deposited. Layer 110 is used to reduce the electrical resistance between the electrical conductor 124 and the part of layer 107 undergoing the phase change. In another embodiment, not shown, layer 110 is omitted. In layer 110 the further resistor 106 may be formed, as is described below with reference to FIG. 10.

Onto layer 107 or, if present, onto layer 110, masks 111 and 112 shown in FIG. 7 are formed by, e.g., lithography or electron beam writing. Masks 111 each cover parts of layer 107 and, if present, layer 110 which cover the respective electric conductors 124. Masks 112 cover other parts of layer 107 and, if present, layer 110, onto which further electrical conductors 125 will be formed later on. For every memory element, masks 111 and 112 are separated by a distance L, which is typically below 300 nm and preferably between 20 and 200 nm. When lithography is used to form the mask 111 and the mask 112, the minimum distance L is preferably approximately equal to the minimum dimension achievable by said lithography. The shorter the distance L the smaller the electrical power required to induce a phase transition between the first phase and the second phase. The distance L determines the length of the phase change material, which will have a cross section smaller than the contact area at the electrical conductors 124, as will be described below. The phase change material having the reduced cross section is referred to as the volume of the phase change material.

If present, the parts of layer 110 not covered by masks 111 and 112 are removed by isotropic selective etching using e.g. an etch comprising HF. The result obtained at this stage of the process of manufacturing the electric device 100 is shown in FIG. 8. Note that due to the isotropic etching an underetch occurs, see FIGS. 8 and 9. Then the parts of layer 107 not covered by masks 111 and 112 are anisotropically etched, using, e.g., a reactive ion etch comprising Cl. As a result, sidewall spacers composed of the phase change material are formed inside the openings 108 at the position not covered by masks 111 and 112. This implies a reduction in cross section of a conductive path in the layer 107 between the first contact area covered by mask 111 and a second contact area covered by mask 112. The cross section is smaller than the first contact area and the second contact area. For each memory element 170 the side wall spacers formed by layer 107 are electrically connected to those parts of layer 107 and, if present, layer 110 which were covered by masks 111 and 112 during the etching step. As shown in the cross section of FIG. 10 the sidewall spacers formed of layer 107 have a width W that is substantially equal to the thickness LT of layer 107. In other words, the main surface has a step profile, formed in this example by layer 109, and the step of reducing the cross section comprises an anisotropic etching step for forming a sidewall spacer along at least a part of the step profile.

After removing the masks 111 and 112 the pre-fabricated electric device 100 shown in top view in FIG. 9 is obtained. Every memory cell of this electric device 100 has a layer 107 of phase change material, which comprises a part defined by mask 111 and a part defined by mask 112. These two parts are connected by two sidewall spacers formed of layer 107.

In a subsequent step the pre-fabricated electric device 100 shown in FIG. 9 is covered by a layer 106 of a material of the further resistor, which material is the same as described above with reference to the further resistor 6 of FIG. 4.

After providing the layer 106, masks 111' and 112' are formed, which masks are similar to the masks 111 and 112. Subsequently, the layer 106 is anisotropically etched using, e.g., a plasma etch comprising $CF_4:CHF_3$. As shown in the cross section of FIG. 10, sidewall spacers are formed of layer 106 in a way analogous to the formation of the sidewall spacers of layer 107. The sidewall spacers formed of layer 106 have a width V which is substantially equal to the thickness of layer 106.

In an alternative embodiment layer 107 and layer 106 are interchanged, i.e. layer 106 is provided before providing layer 107 on top of layer 106. In another embodiment layer 106 is separated from layer 107 by an intermediate layer which may comprise, e.g., silicon dioxide. Also in this embodiment the further resistor 106 is parallel to the resistor 107. In contrast to the embodiment described before, in this embodiment the resistor 107 is not in direct contact with the further resistor 106.

In an alternative embodiment both layer 107 and layer 106 are provided prior to forming the masks 111 and 112. Both layer 107 and layer 106 are then anisotropically etched without the need of an additional step of forming the masks 111' and 112'.

In one embodiment the method of manufacturing the electric device 100 comprises a step in which a mask 128 is provided, e.g., by means of lithography. The mask 128 has openings 129 such that for each of the memory cells one of the two side wall spacers formed of layer 107 is exposed, as shown in FIG. 11. In a subsequent step this mask is then used to remove, e.g. by etching, the exposed portions of layer 106 and layer 107. As a result, in every memory cell these two parts are now connected by only one sidewall spacer formed of layer 107. Subsequently, mask 128 is removed. In another embodiment the mask 128 is omitted and the layer 106 and the layer 107 each have two sidewall spacers.

The layer 107 thus obtained, i.e. having one or two sidewalls, forms the resistor 170 of the electric device 100. The pre-fabricated electric device 100 is provided with a dielectric layer 126 of, e.g., silicon dioxide. In one embodiment the pre-fabricated electric device shown in FIG. 10 is then subjected to a material removal treatment such as, e.g., chemical mechanical polishing, to reduce the height of the sidewall spacers of layers 106 and 107 and to obtain a smooth surface, which is advantageous for further processing. In that case it is advantageous if layer 109 is composed of two layers of different materials, e.g. a lower layer of a relatively hard material such as, e.g., silicon nitride on top of which there is a layer of a relatively soft material such as, e.g., silicon oxide. During the material removal treatment the relatively hard layer is used as a stop layer, thereby yielding a layer 107 of phase change material having a well-defined height H of preferably 10 to 100 nm. After this material removal treatment, surface 199, shown in FIG. 10, is obtained.

Subsequently, an additional dielectric layer 126' is provided in which dielectric layer 126' openings 132, shown in FIG. 12, are created to expose, for each memory cell, a part of the layer 106, the conductive layer 110, if present, or layer 107 which was covered by mask 112 at an earlier stage. These openings 132 are provided with further electric conductors for electrically contacting the resistor 170. In a later step the further electric conductor is electrically connected to the output line.

The electric device 100 thus obtained has a body 102 which has a resistor 170. The resistor 170 is composed of a layer 107 of a phase change material being changeable between a first phase and a second phase. The resistor 170 has a first electrical resistance when the phase change material is in the first phase, and a second electrical resistance, different from the first electrical resistance, when the phase change material is in the second phase. In an embodiment the body 102 further has a further resistor formed by layer 106. In another embodiment, the further resistor 106 is absent. The further resistor is able to conduct a current and is designed to switch the total resistance of layers 106 and 107 between relatively small values which allow for a relatively easy detection of the resulting resistance value of the combination of the two layers 106 and 107.

In this embodiment of the electric device 100 the layer 107 of the phase change material constitutes a conductive path between a first contact area and a second contact area. When layer 110 is omitted, the first contact area is the area in which the electrical conductor 124 contacts the layer 107 of the phase change material, see e.g. FIGS. 5 and 8, and the second contact area is the area in which the further electrical conductor provided to opening 132 contacts the layer 107 of the phase change material, see FIG. 12.

A cross section of the conductive path constituted by the layer of the phase change material is smaller than the first contact area and the second contact area. When layer 110 is present, the first contact area and the second contact area effectively are the areas in which the current moves from layer 110 into layer 107. Due to the isotropic etching of layer 110 and the anisotropic etching of layer 107, the layers 10 do not contact the sidewall spacers of layer 107 directly, but at a distance, see FIGS. 8 and 9. In this case, the first contact area and the second contact area are still not at the border of the volume defined by the sidewall spacer and are larger than a cross section of the sidewall spacer.

The current density inside the sidewall spacer is higher than at the first contact area and at the second contact area, and, therefore, the phase change material at the sidewall spacer rather than at the first contact area and/or at the second contact area will undergo a phase transition.

In an embodiment, layer 110 is omitted and the volume of the phase change material with the reduced cross section has a length L of 50 nm, a height H of 20 nm and a width W of 15 nm. The cross section is thus equal to H times W which equals 300 nm². The first contact area defined by electrical conductor 124 is equal to the second contact area defined by opening 132, which is equal to 100 nm times 100 nm. Thus the first contact area and the second contact area each have a size of 10,000 nm² which is larger than the cross section of 300 nm². The phase change material is $Sb_{72}Te_{20}Ge_8$. The volume of the resistor with the reduced cross section has a resistance of 800 Ohm when the phase change material is in the crystalline phase and of more than 100 kOhm when the phase change material is in the amorphous phase. The electrical conductor 124 and the further electrical conductor are composed of tungsten. The contact resistance in the first contact area and the second contact area are each 100 Ohm. Thus, the contact resistance at the first contact area and the second contact area are each smaller than the resistance of the volume of the phase change material having the reduced cross section.

The electric device 100 is particularly advantageous when the phase change material is a fast growth material with a crystallization speed of 1 m/s or more. This type of phase change materials, which comprise compositions of formula $Sb_{1-c}M_c$ with c satisfying $0.05 \leq c \leq 0.61$, and M being one or more elements selected from the group of Ge, In, Ag, Ga, Te, Zn and Sn, have a crystallization speed $v_{cr}$ which is approximately a linear function of the ratio Sb/M, see e.g. FIG. 13 for the case where M comprises Te. For a given desired switching time for the SET pulse t, which may be imposed by the bandwidth of the selection device 171, the length L and the composition of the phase change material are adjusted such that $L/(2t)=v_{cr}$ holds. Here, the factor 2 accounts for the fact that the crystallization starts from the two outer ends of the volume of the phase change material having the reduced cross section.

When the phase change is induced inside the layer of phase change material, i.e. not at the first contact area or the second contact area, the phase change material constitutes a conductive path between a first contact area and a second contact area, a cross section of the conductive path being smaller than the first contact area and the second contact area. The part of the conductive path having the cross section may have a length $l_{tot}$ and the phase change material may have a crystallization speed $v_{cr}$. When the resistance of the layer of phase change material is to be changed between N different levels, N being an integer larger than 2, N−1 different lengths $l_{i=1 \ldots N-1}$ of the amorphous part of the layer of phase change material have to be realized. One of the states may be entirely crystalline, i.e. $l_1=0$. Examples for three further states are shown schematically in FIG. 14B, the amorphous parts having a length $l_2$, $l_3$ and $l_{tot}$, respectively. The various states of the layer of phase change material may be obtained, irrespective of the form of the layer of phase change material, by first creating the state with maximum length of the amorphous phase and subsequently partly re-crystallizing this part by a set pulse which is sufficient to heat the amorphous part of the phase change material to a temperature above the crystallization temperature. The corresponding pulse sequence may be provided by the signal generator 400, and is shown in and described with reference to FIG. 15A. The duration of this set pulse determines the amount of phase change material which is re-crystallized. Different lengths $l_{i=1 \ldots N-1}$ correspond to different pulse durations $t_{i=1 \ldots N-1}$. The minimum time difference between two set pulses is $dt=t_i-t_{i-1}$. The minimum value for dt may be e.g. 5 ns or 10 ns. The maximum growth from the largest amorphous state to the crystalline state must then take at least (N−1)*dt. When the amorphous state grows from two outer ends of a line, as shown e.g. in FIG. 14B, the line must have a minimum length of at least $l_{min}=2*dt*(N-1)*v_{cr}$, where $v_{cr}$ is the crystallization speed of the phase change material. Typical values of N, dt and $v_{cr}$ as well as the corresponding $l_{min}$ are given in Table 4. Examples of fast growth materials and their crystallization speed $v_{cr}$ are shown in FIG. 13.

TABLE 4

Minimum length $l_{min}$ of the largest amorphous part of the phase change layer

| N | dt (ns) | $v_{cr}$ (m/s) | $l_{min}$ (nm) |
|---|---------|----------------|----------------|
| 2 | 5       | 3              | 15             |
| 4 | 5       | 3              | 45             |
| 8 | 5       | 3              | 105            |
| 2 | 5       | 1.5            | 8              |
| 4 | 5       | 1.5            | 23             |
| 8 | 5       | 1.5            | 53             |
| 2 | 5       | 5              | 25             |
| 4 | 5       | 5              | 75             |
| 8 | 5       | 5              | 175            |
| 2 | 10      | 3              | 30             |
| 4 | 10      | 3              | 90             |
| 8 | 10      | 3              | 210            |

Single pulse strategies in which a new resistance value is directly written in a resistor which had a different resistance value may be possible, in particular when the resistance value is read prior to writing the new resistance value and taken into account during writing. Alternatively, two pulses may be used, one for achieving a well defined condition and the second one for writing, i.e. for setting the resistance value to the desired value. Because the resistance value is set starting from a well-defined state, the pulse to set the desired new resistance value is independent of the previous resistance value. In FIGS. 15A and 15B two examples of different strategies are depicted for N=4. In the strategy of FIG. 15A, first a relatively short and high power pulse of 0.6 mA and 2 V is applied for 15 ns to make the largest amorphous portion (i=4). A subsequent crystallization pulse of lower power, such as e.g. 0.3 mA and 1 V, is applied for a time $t_1$=75 ns, $t_2$=50 ns or $t_3$=25 ns, which leads to a decrease of the amorphous part by crystal growth at the amorphous-crystalline boundary. For a pulse of duration $t_1$ the entire amorphous part is recrystallized, for a pulse of duration $t_2$ and t3 only a part of the amorphous portion is recrystallized, as shown schematically in FIG. 14B. The example given relates to a layer of phase change material of composition $Ge_{15}Sb_{51}Te_{34}$ having the dimensions described with reference to FIG. 16A.

In an alternative strategy, a first pulse is applied to completely recrystallize (i=1) the previous amorphous part, if present. Then a melt pulse of variable power is applied, leading to amorphous portions of variable size, shown for i=2, 3 and 4 in FIG. 15B. The strategy of FIG. 15A has the advantage that, because of the well defined re-crystallization of the amorphous part in fast growth materials, the timing of the re-crystallization pulse is relatively easy. The strategy of FIG. 15B has the advantage that timing of the first and second pulse is the same for all levels, allowing easy parallel programming of many cells along a word line.

Alternatively or in addition, a write-read-correct pulse-scheme may be proposed like in multilevel-flash cells. This is particularly useful for memories where bit-density is key and speed is less important.

In FIGS. 16A and 16B the resistance R of a layer of phase change material is plotted versus the duration of the set pulse, using the strategy shown in FIG. 15A. The fast growth material was a layer of $Ge_{15}Sb_{51}Te_{34}$ having a length of 400 nm, a width of 30 nm and a height of 30 nm, and a layer of $Ge_8Sb_{72}Te_{20}$ having a length of 600 nm, a width of 100 nm and a height of 30 nm. Both graphs show the approximately linear relation between the duration of the set pulse and the resistance value obtained thereby. This feature is characteristic of the fast growth material used in the electric device according to the invention.

In summary, the electric device 100 according to the invention has a resistor comprising a layer 7, 107 of a phase change material which is changeable between a first phase with a first electrical resistivity and a second phase with a second electrical resistivity different from the first electrical resistivity. The phase change material is a fast growth material. The electric device 100 further comprises a switching signal generator 400 for switching the resistor between at least three different electrical resistance values by changing a corresponding portion of the layer 7, 107 of the phase change material from the first phase to the second phase.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention claimed is:

1. An electric device having:
 a resistor comprising a layer of a phase change material being changeable between a first phase with a first electrical resistivity and a second phase with a second electrical resistivity different from the first electrical resistivity, the phase change material being a fast growth material, the resistor being switchable between at least three different electrical resistance values by changing a corresponding portion of the layer of the phase change material from the first phase to the second phase.

2. An electric device as claimed in claim 1, further comprising means for switching the resistor between the at least three different electrical resistance values.

3. An electric device as claimed in claim 1, wherein the portion of the layer of phase change material is in direct contact with a further resistor arranged in parallel with the resistor.

4. An electric device as claimed in claim 3, wherein the further resistor has a further electrical resistance which is smaller than the largest of the at least three different electrical resistance values.

5. An electric device as claimed in claim 4, further comprising a read out signal generator for providing an electric read signal having a read voltage (V) to the resistor and a read out circuit for determining the resistance value from the electric read signal, the read out circuit requiring a minimum current (I), the further resistance ($R_{fr}$) being smaller than the read voltage (V) divided by the minimum current (I), ($R_{fr}$<V/I).

6. An electric device as claimed in claim 4, further comprising a read out signal generator for providing an electric read signal having a read current (I) to the resistor and a read out circuit for determining the resistance value from the electric read signal, the read out circuit requiring a minimum voltage (V), the further resistance ($R_{fr}$) being smaller than the minimum voltage (V) divided by the read current (I), ($R_{fr}$<V/I).

7. An electric device as claimed in claim 4, wherein the resistor is switchable between N different electrical resistance values, N being an integer larger than two, the electric device further comprising a read out circuit for determining the resistance value, the read out circuit being able to discriminate between two resistance values having a relative resistance difference larger than or equal to a minimum detectable relative resistance difference $(dR/R)_{min}$, a ratio $(k=R_{fr}/R_{cr})$ of the further resistance $(R_{fr})$ over a minimum resistance $(R_{cr})$ of the layer of the phase change material satisfying $k/[(1+k)(N-1)]>(dR/R)_{min}$.

8. An electric device as claimed in claim 3, wherein the layer of phase change material and the further resistor have a contact resistance of $10^{-7}$ V cm²/A or less, preferably $10^{-8}$ V cm²/A or less, preferably $10^{-9}$ V cm²/A or less.

9. An electric device as claimed in claim 1, wherein the phase change material constitutes a conductive path between a first contact area and a second contact area, a cross section of the conductive path being smaller than the first contact area and the second contact area.

10. An electric device as claimed in claim 5, wherein a part of the conductive path having the said cross section constitutes a volume of phase change material, the volume having an electrical resistance which is larger than an electrical contact resistance at the first contact area and/or at the second contact area, irrespective of whether the phase change material is in the first phase or the second phase.

11. An electric device as claimed in claim 1, wherein the phase change material is a composition of formula $Sb_{1-c}M_c$ with c satisfying $0.05 \leq c \leq 0.61$, and M being one or more elements selected from the group of Ge, In, Ag, Ga, Te, Zn and Sn.

12. An electric device as claimed in claim 11, wherein c satisfies $0.05 \leq c \leq 0.5$, and preferably $0.10 \leq c \leq 0.5$.

13. An electric device as claimed in claim 1, wherein the phase change material is substantially free of Te.

14. An electric device as claimed in claim 1, wherein the resistor is comprised in a body, the resistor constitutes a memory element, and the body further comprises:
an array of memory cells, each memory cell comprising a respective memory element and a respective selection device, and
a grid of selection lines,
each memory cell being individually accessible via the respective selection lines connected to the respective selection device.

15. An electric device as claimed in claim 14, wherein:
the selection device comprises a metal oxide semiconductor field effect transistor having a source region, a drain region and a gate region, and
the grid of selection lines comprises N first selection line, M second selection lines, and an output line,
the resistor of each memory element electrically connecting a first region selected from the source region and the drain region of the corresponding metal oxide semiconductor field effect transistor to the output line, a second region of the corresponding metal oxide semiconductor field effect transistor, selected from the source region and the drain region and lying free from the first region, being electrically connected to one of the N first selection lines, the gate region being electrically connected to one of the M second selection lines.

16. The electronic device of claim 1, wherein the fast growth material has a crystal growth mechanism wherein crystalline growth occurs along the interface between an amorphous phase of the material and a crystalline phase of the material, and the phase change material being a composition of the formula $Sb_{1-c}M_c$, where $0.05 \leq c \leq 0.61$, and M is from the group of Ge, In, Ag, Ga, Te, Zn, and Sn.

17. An electric device comprising:
a resistor comprising a layer of a phase change material being changeable between a first phase with a first electrical resistivity and a second phase with a second electrical resistivity different from the first electrical resistivity, the phase change material being a fast growth material characterized by its crystal growth along an interface between an amorphous phase of the material and a crystalline phase of the material, the resistor being switchable between at least three different electrical resistance values by changing a corresponding portion of the layer of the phase change material from the first phase to the second phase.

18. The electronic device of claim 17, wherein the phase change material is a composition of the formula $Sb_{1-c}M_c$, where $0.05 \leq c \leq 0.61$, and M is from the group of Ge, In, Ag, Ga, Te, Zn, and Sn.

19. An electric device comprising:
a resistor comprising a layer of a phase change material being changeable between a first phase with a first electrical resistivity and a second phase with a second electrical resistivity different from the first electrical resistivity, the resistor being switchable between at least three different electrical resistance values by changing a corresponding portion of the layer of the phase change material from the first phase to the second phase, and the phase change material being a fast growth material and a composition of one of: the formula $Sb_{1-c}M_c$, where $0.05 \leq c \leq 0.61$, and M is from the group of Ge, In, Ag, Ga, Te, Zn, and Sn; a material including Ge, Ga, or Ge and Ga; and a material that is substantially free of Te.

20. The electronic device of claim 19, wherein the fast growth material is a material including at least one of Ge and Ga at a concentration which in total is between 10 atomic percent and 30 atomic percent.

21. The electronic device of claim 19, wherein the fast growth material is a material including at least one of Ge and Ga at a concentration which in total more than 20 atomic percent, and including at least one of In and Sn at a concentration which in total is below 30 atomic percent.

* * * * *